United States Patent
Hashim

(10) Patent No.: US 7,186,148 B2
(45) Date of Patent: Mar. 6, 2007

(54) COMMUNICATIONS CONNECTOR FOR IMPARTING CROSSTALK COMPENSATION BETWEEN CONDUCTORS

(75) Inventor: Amid Hashim, Plano, TX (US)

(73) Assignee: CommScope Solutions Properties, LLC, Sparks, NV (US)

(*) Notice: Subject to any disclaimer, the term of this patent is extended or adjusted under 35 U.S.C. 154(b) by 0 days.

(21) Appl. No.: 11/208,980

(22) Filed: Aug. 22, 2005

(65) Prior Publication Data

US 2006/0121790 A1    Jun. 8, 2006

(51) Int. Cl.
*H01R 24/00* (2006.01)
(52) U.S. Cl. .................... 439/676; 439/941
(58) Field of Classification Search .......... 439/676, 439/941, 418
See application file for complete search history.

(56) References Cited

U.S. PATENT DOCUMENTS

| | | |
|---|---|---|
| 5,186,647 A | 2/1993 | Denkmann et al. |
| 5,299,956 A | 4/1994 | Brownell et al. |
| 5,310,363 A | 5/1994 | Brownell et al. |
| 5,326,284 A | 7/1994 | Bohbot et al. |
| 5,328,390 A | 7/1994 | Johnston et al. |
| 5,362,257 A | 11/1994 | Neal et al. |
| 5,397,862 A | 3/1995 | Bockelman et al. |
| 5,414,393 A | 5/1995 | Rose et al. |
| 5,432,484 A | 7/1995 | Klas et al. |
| 5,547,405 A | 8/1996 | Pinney et al. |
| 5,571,035 A | 11/1996 | Ferrill |
| 5,587,884 A | 12/1996 | Raman |
| 5,618,185 A | 4/1997 | Aekins |

(Continued)

FOREIGN PATENT DOCUMENTS

EP    0 525 703 B1    2/1993

(Continued)

OTHER PUBLICATIONS

Belden CDT Networking Data Sheet for the 10GX Module www.BeldenIBDN.com

Primary Examiner—Gary F. Paumen
(74) Attorney, Agent, or Firm—Myers Bigel Sibley & Sajovec

(57) ABSTRACT

A communications connector includes: a dielectric mounting substrate; at least four pairs of conductors mounted on the mounting substrate, each of the conductors including a free end segment, each of the free end segments being positioned in side-by-side and generally parallel relationship; and at least four pairs of terminals mounted on the mounting substrate, wherein each of the pairs of terminals is electrically connected to a respective pair of conductors. A first pair of conductor free end segments is immediately adjacent each other, a second pair of conductor free end segments is immediately adjacent each other and positioned one side of the first pair, a fourth pair of conductor free end segments is immediately adjacent each other and positioned on an opposite side of the first pair, and a third pair of conductor free end segments sandwiches the first pair, with one of the conductor free end segments of the third pair being disposed between the first and second pairs, and the other of the conductor free end segments being disposed between the first and fourth pairs. Each of the first, second and fourth pairs of conductors includes a crossover between the conductors of the pairs, and wherein the third pair of conductors includes two crossovers between its conductors.

45 Claims, 16 Drawing Sheets

U.S. PATENT DOCUMENTS

| | | | |
|---|---|---|---|
| 5,779,503 | A | 7/1998 | Tremblay et al. |
| 5,911,602 | A | 6/1999 | Vaden |
| 5,915,989 | A | 6/1999 | Adriaenssens et al. |
| 5,921,818 | A | 7/1999 | Larsen et al. |
| 5,947,772 | A * | 9/1999 | Arnett et al. ............... 439/676 |
| 5,961,354 | A | 10/1999 | Hashim |
| 5,967,853 | A | 10/1999 | Hashim |
| 5,971,813 | A | 10/1999 | Kunz et al. |
| 5,975,919 | A * | 11/1999 | Arnett et al. ................ 439/82 |
| 5,989,071 | A | 11/1999 | Larsen et al. |
| 5,997,358 | A | 12/1999 | Adriaenssens et al. |
| 6,017,247 | A | 1/2000 | Gwiazdowski |
| 6,042,427 | A | 3/2000 | Adriaenssens et al. |
| 6,050,843 | A | 4/2000 | Adriaenssens et al. |
| 6,102,730 | A | 8/2000 | Kjeldahl et al. |
| 6,116,964 | A * | 9/2000 | Goodrich et al. ........... 439/676 |
| 6,120,330 | A | 9/2000 | Gwiazdowski |
| 6,165,023 | A | 12/2000 | Troutman et al. |
| 6,170,154 | B1 | 1/2001 | Swarup |
| 6,186,834 | B1 | 2/2001 | Arnett et al. |
| 6,196,880 | B1 | 3/2001 | Goodrich et al. |
| 6,238,235 | B1 | 5/2001 | Shavit et al. |
| 6,270,358 | B1 | 8/2001 | Nozick |
| 6,270,381 | B1 | 8/2001 | Adriaenssens |
| 6,312,290 | B1 | 11/2001 | Belopolsky |
| 6,350,158 | B1 * | 2/2002 | Arnett et al. ............... 439/676 |
| 6,353,540 | B1 | 3/2002 | Akiba et al. |
| 6,356,162 | B1 | 3/2002 | DeFlandre et al. |
| 6,364,694 | B1 | 4/2002 | Lien |
| 6,379,157 | B1 | 4/2002 | Curry et al. |
| 6,379,198 | B1 | 4/2002 | Arnett et al. |
| 6,407,542 | B1 | 6/2002 | Conte |
| 6,428,362 | B1 | 8/2002 | Phommachanh |
| 6,443,776 | B2 * | 9/2002 | Reichle ....................... 439/676 |
| 6,443,777 | B1 | 9/2002 | McCurdy et al. |
| 6,454,541 | B1 * | 9/2002 | Ijiri et al. ....................... 417/53 |
| 6,464,529 | B1 | 10/2002 | Jensen et al. |
| 6,520,807 | B2 | 2/2003 | Winings |
| 6,524,128 | B2 | 2/2003 | Marowsky et al. |
| 6,530,810 | B2 * | 3/2003 | Goodrich et al. ........... 439/676 |
| 6,558,204 | B1 | 5/2003 | Weatherley |
| 6,558,207 | B1 | 5/2003 | Pepe et al. |
| 6,561,838 | B1 | 5/2003 | Blichfeldt |
| 6,571,187 | B1 | 5/2003 | Conte |
| 6,592,395 | B2 | 7/2003 | Brown et al. |
| 6,647,357 | B1 | 11/2003 | Conte |
| 6,716,964 | B1 | 4/2004 | Chinnadurai |
| 6,764,348 | B2 * | 7/2004 | Han et al. ................... 439/676 |
| 6,811,442 | B1 | 11/2004 | Lien et al. |
| 6,962,503 | B2 | 11/2005 | Aekins |
| 2001/0018287 | A1 | 8/2001 | Relchle |
| 2001/0021608 | A1 | 9/2001 | Borbolla et al. |
| 2001/0048592 | A1 | 12/2001 | Nimomiya |
| 2002/0088977 | A1 | 7/2002 | Mori et al. |
| 2003/0129880 | A1 | 7/2003 | Arnett et al. |
| 2004/0002267 | A1 | 1/2004 | Hatterscheid et al. |
| 2005/0254223 | A1 | 11/2005 | Hashim |
| 2006/0121788 | A1 * | 6/2006 | Pharney ...................... 439/676 |
| 2006/0121789 | A1 * | 6/2006 | Hashim ...................... 439/676 |
| 2006/0160428 | A1 * | 7/2006 | Hashim ...................... 439/676 |

FOREIGN PATENT DOCUMENTS

| | | |
|---|---|---|
| EP | 0 901 201 | 3/1999 |
| EP | 1 059 704 | 12/2000 |
| EP | 1 191 646 | 3/2002 |
| EP | 1 435 679 | 7/2004 |
| WO | WO 94/05092 | 3/1994 |
| WO | WO 99/53574 | 10/1999 |
| WO | WO 2003-019734 | 3/2003 |
| WO | WO 03-090322 | 10/2003 |

* cited by examiner

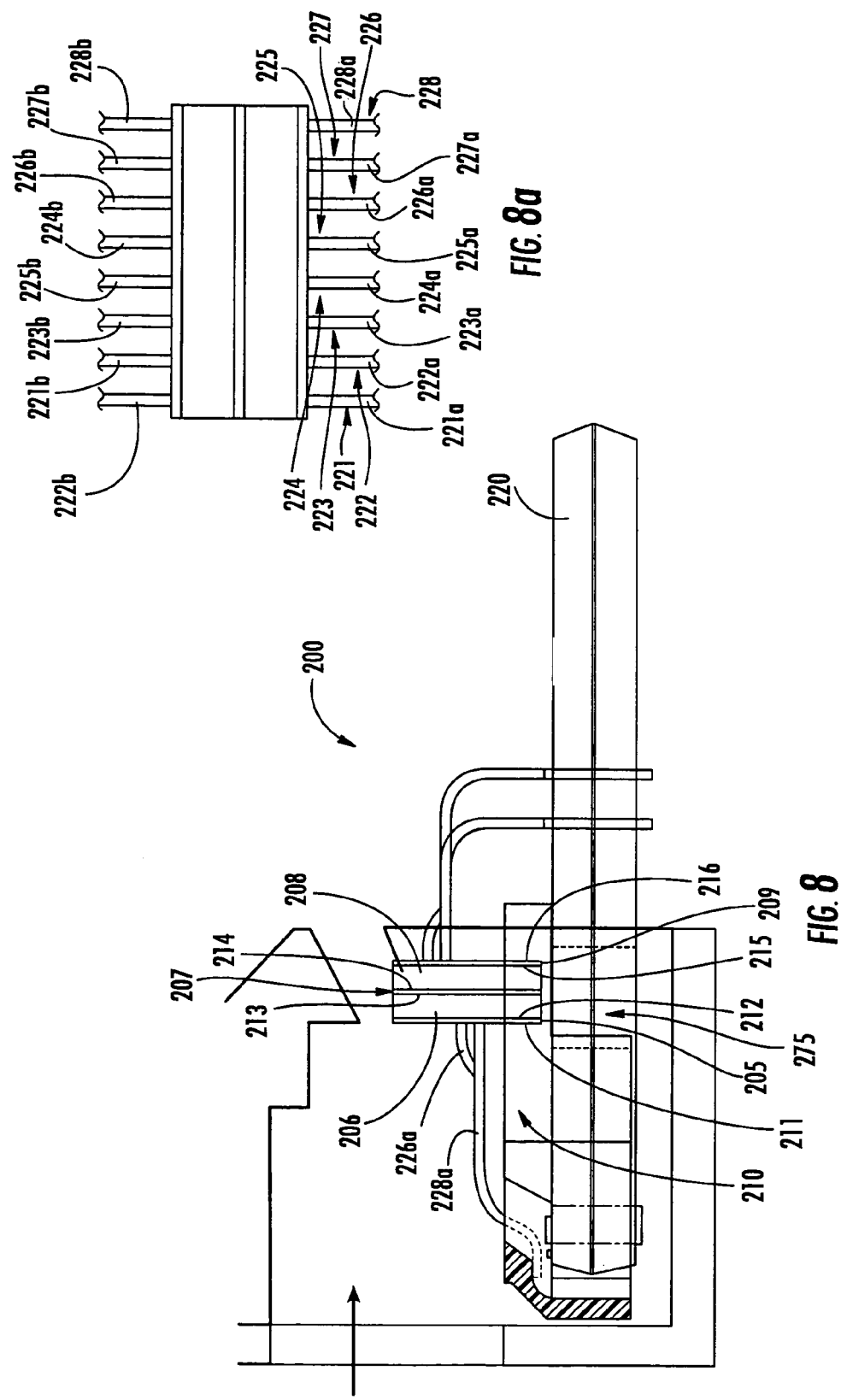

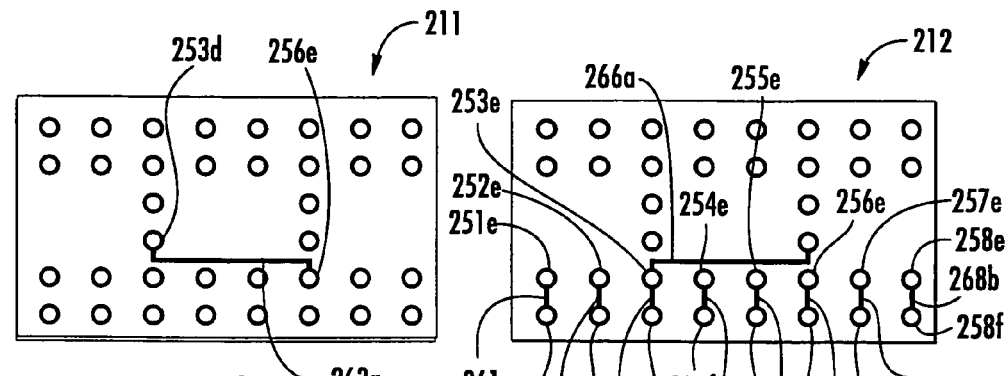
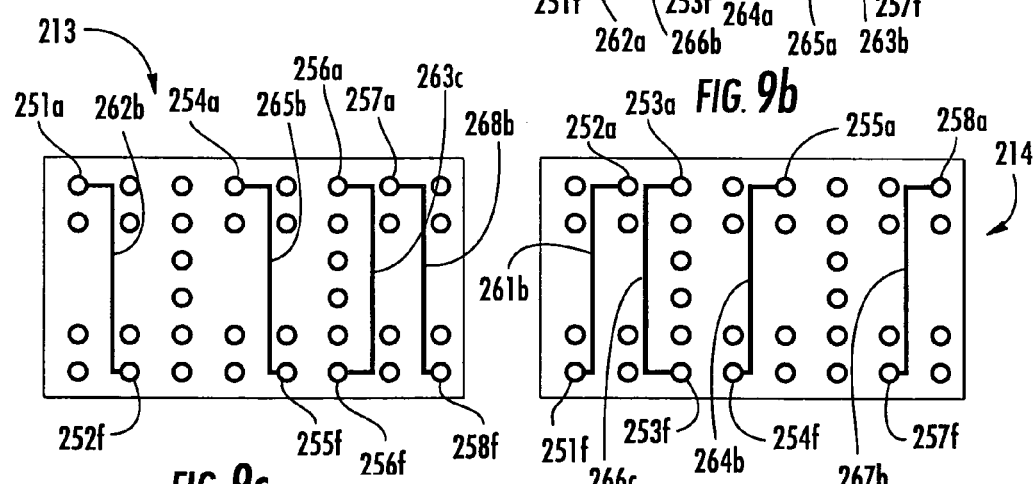
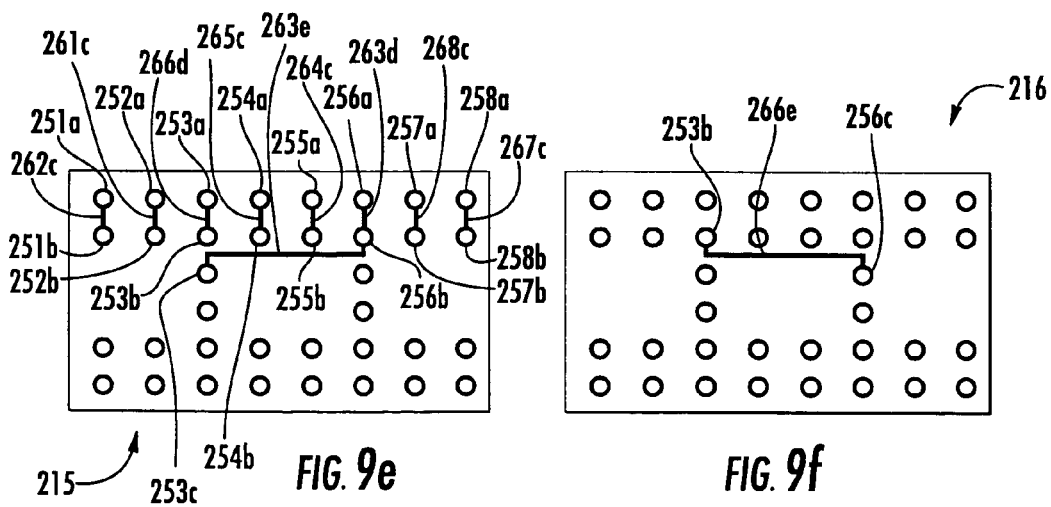
FIG. 9a
FIG. 9b
FIG. 9c
FIG. 9d
FIG. 9e
FIG. 9f

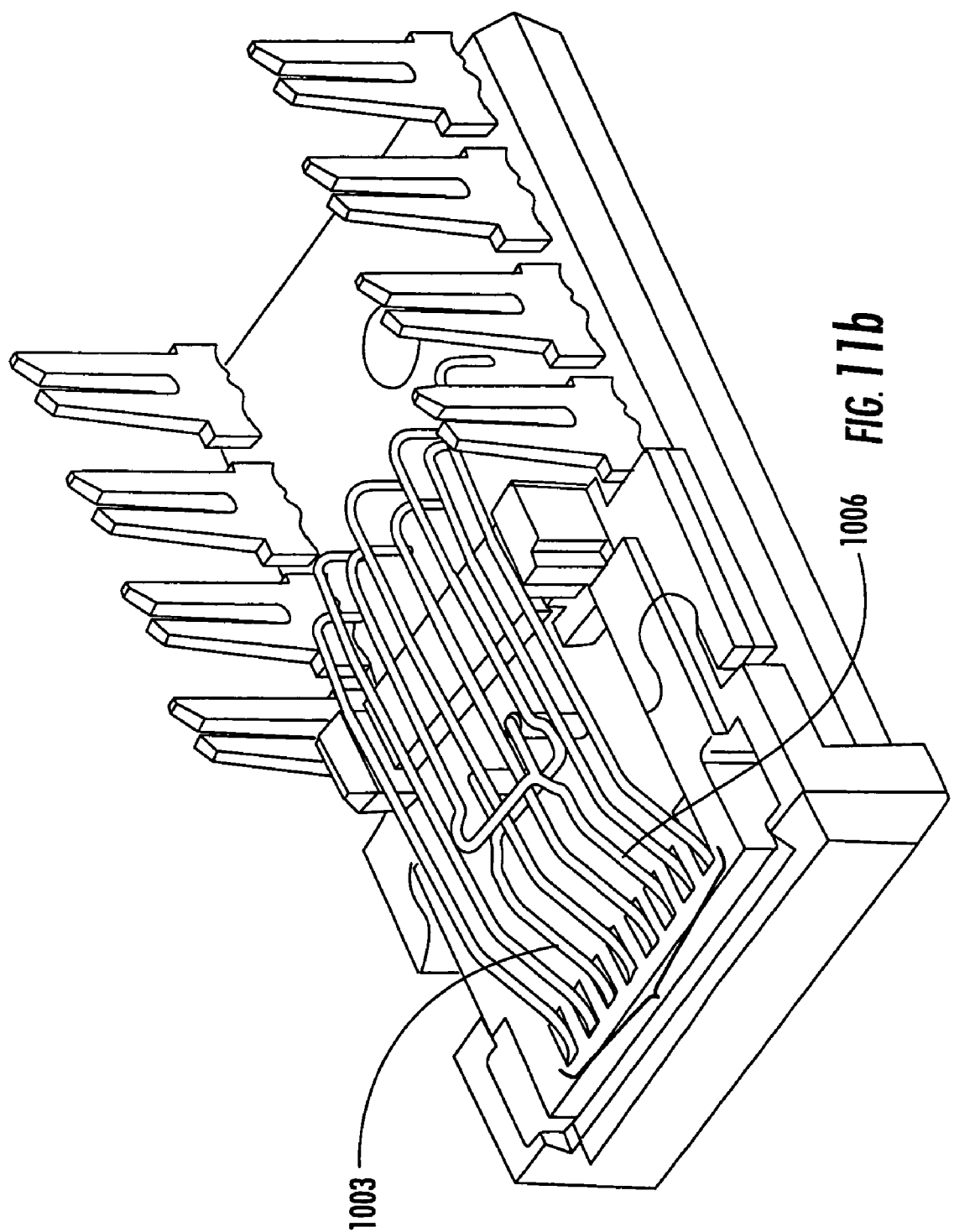

US 7,186,148 B2

COMMUNICATIONS CONNECTOR FOR IMPARTING CROSSTALK COMPENSATION BETWEEN CONDUCTORS

FIELD OF THE INVENTION

The present invention relates generally to communication connectors and more particularly to near-end crosstalk (NEXT) and far-end crosstalk (FEXT) compensation in communication connectors.

BACKGROUND OF THE INVENTION

In an electrical communication system, it is sometimes advantageous to transmit information signals (video, audio, data) over a pair of wires (hereinafter "wire-pair" or "differential pair") rather than a single wire, wherein the transmitted signal comprises the voltage difference between the wires without regard to the absolute voltages present. Each wire in a wire-pair is susceptible to picking up electrical noise from sources such as lightning, automobile spark plugs, and radio stations, to name but a few. Because this type of noise is common to both wires within a pair, the differential signal is typically not disturbed. This is a fundamental reason for having closely spaced differential pairs.

Of greater concern, however, is the electrical noise that is picked up from nearby wires or pairs of wires that may extend in the same general direction for some distances and not cancel differentially on the victim pair. This is referred to as crosstalk. Particularly, in a communication system involving networked computers, channels are formed by cascading plugs, jacks and cable segments. In such channels, a modular plug often mates with a modular jack, and the proximities and routings of the electrical wires (conductors) and contacting structures within the jack and/or plug also can produce capacitive as well as inductive couplings that generate near-end crosstalk (NEXT) (i.e., the crosstalk measured at an input location corresponding to a source at the same location) as well as far-end crosstalk (FEXT) (i.e., the crosstalk measured at the output location corresponding to a source at the input location). Such crosstalks occur from closely-positioned wires over a short distance. In all of the above situations, undesirable signals are present on the electrical conductors that can interfere with the information signal. When the same noise signal is added to each wire in the wire-pair, the voltage difference between the wires will remain about the same and differential crosstalk is not induced, while at the same time the average voltage on the two wires with respect to ground reference is elevated and common mode crosstalk is induced. On the other hand, when an opposite but equal noise signal is added to each wire in the wire pair, the voltage difference between the wires will be elevated and differential crosstalk is induced, while the average voltage on the two wires with respect to ground reference is not elevated and common mode crosstalk is not induced.

U.S. Pat. No. 5,997,358 to Adriaenssens et al. (hereinafter "the '358 patent") describes a two-stage scheme for compensating differential to differential NEXT for a plug-jack combination (the entire contents of the '358 patent are hereby incorporated herein by reference, as are U.S. Pat. Nos. 5,915,989; 6,042,427; 6,050,843; and 6,270,381). Connectors described in the '358 patent can reduce the internal NEXT (original crosstalk) between the electrical wire pairs of a modular plug by adding a fabricated or artificial crosstalk, usually in the jack, at one or more stages, thereby canceling or reducing the overall crosstalk for the plug-jack combination. The fabricated crosstalk is referred to herein as a compensation crosstalk. This idea can often be implemented by twice crossing the path of one of the differential pairs within the connector relative to the path of another differential pair within the connector, thereby providing two stages of NEXT compensation. Another common technique is to cross the conductors of pairs 1, 2 and 4 (as defined in designation T568B of TIA-568-B.2) and leaving the conductors of pair 3 uncrossed (see, e.g., U.S. Pat. No. 5,186,647), then including a second compensation stage (e.g., in the form of a capacitor) on an attached printed wiring board. This scheme can be more efficient at reducing the NEXT than a scheme in which the compensation is added at a single stage, especially when the second and subsequent stages of compensation include a time delay that is selected to account for differences in phase between the offending and compensating crosstalk. This type of arrangement can include capacitive and/or inductive elements that introduce multi-stage crosstalk compensation, and is typically employed in jack lead frames and PWB structures within jacks. These configurations can allow connectors to meet "Category 6" performance standards set forth in ANSI/EIA/TIA 568, which are primary component standards for mated plugs and jacks for transmission frequencies up to 250 MHz.

Alien NEXT is the differential crosstalk that occurs between communication channels. Obviously, physical separation between jacks will help and/or typical crosstalk approaches may be employed. However, a problem case may be "pair 3" of one channel crosstalking to "pair 3" of another channel, even if the pair 3 plug and jack wires in each channel are remote from each other and the only coupling occurs between the routed cabling. To reduce this form of alien NEXT, shielded systems containing shielded twisted pairs or foiled twisted pair configurations may be used. However, the inclusion of shields can increase cost of the system. Another approach to reduce or minimize alien NEXT utilizes spatial separation of cables within a channel and/or spatial separation between the jacks in a channel. However, this is typically impractical because bundling of cables and patch cords is common practice due to "real estate" constraints and ease of wire management.

In spite of recent strides made in improving mated connector (i.e., plug-jack) performance, and in particular reducing crosstalk at elevated frequencies (e.g., 500 MHz—see U.S. patent application Ser. No. 10/845,104, entitled NEXT High Frequency Improvement by Using Frequency Dependent Effective Capacitance, filed May 4, 2004, the disclosure of which is hereby incorporated herein by reference), channels utilizing connectors that rely on either these teachings or those of the '358 patent can still exhibit unacceptably high alien NEXT at very high frequencies (e.g., 500 MHz). As such, it would be desirable to provide connectors and channels used thereby with reduced alien NEXT at very high frequencies.

One solution is offered in co-pending and co-assigned U.S. patent application Ser. No. 11/044,088 (the '088 application), filed Mar. 25, 2005, the disclosure of which is hereby incorporated herein. The '088 application proposes to reduce the conversion of differential to common mode crosstalk by eliminating crossovers between pairs 1, 2 and 4 of the conductors of a connector and introducing a crossover only in pair 3. This solution can reduce the conversion of differential to common mode crosstalk considerably. However, such an arrangement may fail to compensate for common mode crosstalk induced on pair 3 when either of pairs 2 or 4 is differentially excited, and further may fail to compensate for differential to common mode crosstalk between pairs 1 and 2 and pairs 1 and 4. Moreover, the open loop configurations of pairs 1, 2 and 4 can generate and render the connector susceptible to electromagnetic interference.

SUMMARY OF THE INVENTION

The present invention can provide communications jacks with improved differential to common mode and differential to differential NEXT and FEXT performance, particularly at high frequencies. As a first aspect, embodiments of the present invention are directed to a communications connector, comprising: a dielectric mounting substrate; at least four pairs of conductors mounted on the mounting substrate, each of the conductors including a free end segment, each of the free end segments being positioned in side-by-side and generally parallel relationship; and at least four pairs of terminals mounted on the mounting substrate, wherein each of the pairs of terminals is electrically connected to a respective pair of conductors. A first pair of conductor free end segments is immediately adjacent each other, a second pair of conductor free end segments is immediately adjacent each other and positioned one side of the first pair, a fourth pair of conductor free end segments is immediately adjacent each other and positioned on an opposite side of the first pair, and a third pair of conductor free end segments sandwiches the first pair, with one of the conductor free end segments of the third pair being disposed between the first and second pairs, and the other of the conductor free end segments being disposed between the first and fourth pairs. Each of the first, second and fourth pairs of conductors includes a crossover between the conductors of the pairs, and wherein the third pair of conductors includes two crossovers between its conductors. In this configuration, the connector can provide improved crosstalk compensation, particularly for differential to common mode crosstalk.

As a second aspect, embodiments of the present invention are directed to a communications connector, comprising: a dielectric mounting substrate; at least four pairs of conductors mounted on the mounting substrate, each of the conductors including a free end segment, each of the free end segments being positioned in side-by-side and generally parallel relationship; and at least four pairs of terminals mounted on the mounting substrate, wherein each of the pairs of terminals is electrically connected to a respective pair of conductors. A first pair of conductor free end segments is immediately adjacent each other, a second pair of conductor free end segments is immediately adjacent each other and positioned one side of the first pair, a fourth pair of conductor free end segments is immediately adjacent each other and positioned on an opposite side of the first pair, and a third pair of conductor free end segments sandwiches the first pair, with one of the conductor free ends of the third pair being disposed between the first and second pairs, and the other of the conductor free end segments being disposed between the first and fourth pairs. The connector further comprises a wiring board positioned between the free end segments of the conductors and fixed end segments of the conductors mounted in the mounting substrate, the wiring board being generally perpendicular to the conductors, wherein the wiring board includes conductive traces that electrically connect the free end and fixed end segments of each of the conductors. The third pair of conductors forms a crossover on the wiring board, and wherein the first, second and fourth pairs of conductors include a crossover.

As a third aspect, embodiments of the present invention are directed to a communications connector, comprising: a dielectric mounting substrate; at least four pairs of conductors mounted on the mounting substrate, each of the conductors including a free end segment, each of the free end segments being positioned in side-by-side and generally parallel relationship; and at least four pairs of terminals mounted on the mounting substrate, wherein each of the pairs of terminals is electrically connected to a respective pair of conductors. A first pair of conductor free end segments is immediately adjacent each other, a second pair of conductor free end segments is immediately adjacent each other and positioned one side of the first pair, a fourth pair of conductor free end segments is immediately adjacent each other and positioned on an opposite side of the first pair, and a third pair of conductor free end segments sandwiches the first pair, with one of the conductor free end segments of the third pair being disposed between the first and second pairs, and the other of the conductor free end segments being disposed between the first and fourth pairs. The connector further comprises a wiring board positioned between the free end segments of the conductors and fixed end segments of the conductors mounted in the mounting substrate, the wiring board being generally perpendicular to the conductors, wherein the wiring board includes conductive traces that electrically connect the free end and fixed end segments of each of the conductors, the wiring board being suspended above the mounting substrate by the conductors. The mounting substrate includes an aperture sized and positioned to receive a portion of the wiring board when the free end segments of the conductors are deflected by a mating connector.

As a fourth aspect, embodiments of the present invention are directed to a communications connector, comprising: a dielectric mounting substrate; at least four pairs of conductors mounted on the mounting substrate, each of the conductors including a free end segment, each of the free end segments being positioned in side-by-side and generally parallel relationship; and at least four pairs of terminals mounted on the mounting substrate, wherein each of the pairs of terminals is electrically connected to a respective pair of conductors. A first pair of conductor free end segments is immediately adjacent each other, a second pair of conductor free end segments is immediately adjacent each other and positioned one side of the first pair, a fourth pair of conductor free end segments is immediately adjacent each other and positioned on an opposite side of the first pair, and a third pair of conductor free end segments sandwiches the first pair, with one of the conductor free end segments of the third pair being disposed between the first and second pairs, and the other of the conductor free end segments being disposed between the first and fourth pairs. The conductors define first, second, third and fourth coupling regions. The number of the first, second, third and fourth regions having positive differential to differential coupling equals the number of first, second, third and fourth regions having negative differential to differential coupling between the third pair and any of the first, second and fourth pairs, and the number of first, second, third and fourth regions having positive differential to common mode coupling equals the number of first, second, third and fourth regions having negative differential to common mode coupling between any two of the four pairs.

BRIEF DESCRIPTION OF THE FIGURES

FIG. 8 is a side view of the wiring boards and conductors of a communications jack according to alternative embodiments of the present invention.

FIG. 8a is a partial top view of the floating PWB and the conductors of the jack of FIG. 8.

FIGS. 9a–9f are front views of the layers of the floating PWB of the jack of FIG. 8.

FIG. 11b is an isometric view of a communications jack according to an alternative configuration of the jack of FIG. 10.

DETAILED DESCRIPTION OF EMBODIMENTS OF THE INVENTION

Figure 1:
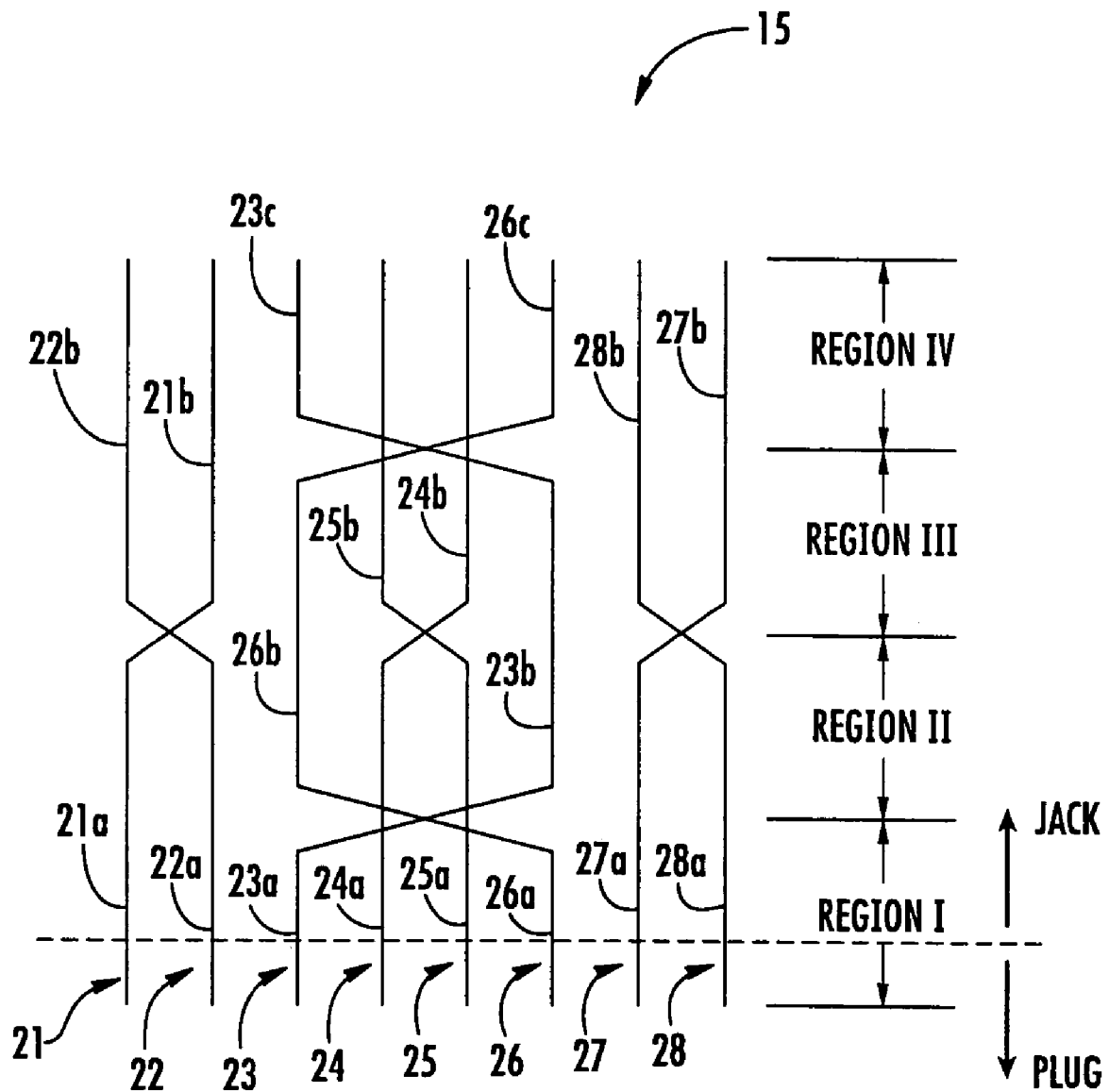
FIG. 1 is a top schematic view of an arrangement of conductors of an embodiment of a communications jack according to the present invention.

The present invention will be described more particularly hereinafter with reference to the accompanying drawings. The invention is not intended to be limited to the illustrated embodiments; rather, these embodiments are intended to fully and completely disclose the invention to those skilled in this art. In the drawings, like numbers refer to like elements throughout. Thicknesses and dimensions of some components may be exaggerated for clarity.

In addition, spatially relative terms, such as "under", "below", "lower", "over", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity.

As used herein the expression "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

This invention is directed to communications connectors, with a primary example of such being a communications jack. As used herein, the terms "forward", "forwardly", and "front" and derivatives thereof refer to the direction defined by a vector extending from the center of the jack toward the plug opening of the jack. Conversely, the terms "rearward", "rearwardly", and derivatives thereof refer to the direction directly opposite the forward direction; the rearward direction is defined by a vector that extends away from the plug opening toward the remainder of the jack. The terms "lateral," "laterally", and derivatives thereof refer to the direction generally parallel with the plane defined by a wiring board on which jack contact wires are mounted and extending away from a plane bisecting the plug in the center. The terms "medial," "inward," "inboard," and derivatives thereof refer to the direction that is the converse of the lateral direction, i.e., the direction parallel with the plane defined by the wiring board and extending from the periphery of the jack toward the aforementioned bisecting plane. Where used, the terms "attached", "connected", "interconnected", "contacting", "mounted" and the like can mean either direct or indirect attachment or contact between elements, unless stated otherwise. Where used, the terms "coupled," "induced" and the like can mean non-conductive interaction, either direct or indirect, between elements or between different sections of the same element, unless stated otherwise.

Referring now to the figures, an arrangement of conductors, designated broadly at 15, is illustrated in FIG. 1. Eight conductors 21–28 are illustrated therein, and are paired according to the designation T568B set forth in TIA-568-B.2, with the conductors of pair 1 (conductors 24 and 25) being adjacent to each other and in the center of the arrangement, the conductors of pair 2 (conductors 27 and 28) being adjacent to each other and occupying the rightmost two positions (from the vantage point of FIG. 1) in the sequence, the conductors of pair 4 (conductors 21 and 22) being adjacent to each other and occupying the leftmost two positions (from the vantage point of FIG. 1) in the sequence, and the conductors of pair 3 (conductors 23 and 26) being positioned between, respectively, pairs 1 and 4 and pairs 1 and 2.

As illustrated in FIG. 1, the conductors of each of the pairs 1, 2 and 4 "crossover" each other once in extending from the near end (where the connector mates with a mating connector) and the far end (where individual wires are connected with each conductor), and the conductors of pair 3 cross over each other twice. The crossovers take place at three locations, the first being a first pair 3 crossover, the second encompassing the crossover of each of pairs 1,2 and 4 and the third being a second pair 3 crossover, thus dividing the conductor arrangement 15 into four coupling regions, designated as regions I–IV. Typically, Region I spans the plug and the jack, accounting for the residual crosstalk from the plug in addition to the crosstalk generated in the portion of the jack contacts ahead of the first crossover location. Regions II–IV typically reside in the jack only, providing compensation that can counteract or substantially cancel the crosstalk from region I. Particularly efficient cancellation may be achieved when the amounts of coupling the regions I–IV are made essentially equal to each other. The amount of coupling in each region is typically directly proportional to its length and inversely proportional to the spacing between its conductors, and can be thus controlled.

It is also directly proportional to the dielectric constant or the magnetic permeability of the medium in which the conductors reside, and can also be thus controlled.

Referring again to FIG. 1, in a first region I, segments 21*a*–28*a* of all of the conductors travel along their original paths. As they approach a region II, the segments 21*a*, 22*a*, 24*a*, 25*a*, 27*a*, 28*a* of the conductors of pairs 4, 1 and 2 continue to travel along their original paths, while the segments 23*a*, 26*a* of pair 3 cross over and merge with segments 23*b*, 26*b*. As the conductors reach a region III, the segments 23*b*, 26*b* of pair 3 continue without crossing over each other, while the segments 21*a*, 22*a*, 24*a*, 25*a*, 27*a*, 28*a* of pairs 4, 1 and 2 cross over each other to merge with segments 21*b*, 22*b*, 24*b*, 25*b*, 27*b*, 28*b*. Finally, as the conductors reach a region IV, the segments 21*b*, 22*b*, 24*b*, 25*b*, 27*b*, 28*b* of pairs 4, 1 and 2 continue without crossing over each other, while the segments 23*b*, 26*b* of pair 3 cross over each other to merge with segments 23*c*, 26*c*. Thus, each of the conductors 21 and 22 of pair 4, conductors 24 and 25 of pair 1, and conductors 27 and 28 of pair 2 cross over each other once, while the conductors 23, 26 of pair 3 cross over each other twice.

For the differential to differential crosstalk on a particular pair combination to cancel, the number of regions having positive differential to differential coupling should equal the number of regions having negative differential to differential coupling. The polarity of the differential to differential coupling between two pairs changes when one and only one of the two pairs experiences a crossover. As shown in Table I the arrangement of FIG. 1 can compensate for the differential to differential crosstalks between pair 3 and each of the other pairs.

TABLE I

Differential to Differential Coupling Polarities

|  | Region I | Region II | Region III | Region IV |
| --- | --- | --- | --- | --- |
| Pair 1-Pair 2 | positive | positive | positive | positive |
| Pair 1-Pair 3 | negative | positive | negative | positive |
| Pair 1-Pair 4 | positive | positive | positive | positive |
| Pair 2-Pair 3 | negative | positive | negative | positive |
| Pair 2-Pair 4 | negative | negative | negative | negative |
| Pair 3-Pair 4 | negative | positive | negative | positive |

For the differential to common mode crosstalk to be canceled, the number of regions having positive differential to common mode coupling should equal the number of regions having negative differential to common mode coupling. The polarity of the differential to common mode coupling from a driven pair to a victim pair changes when the differentially driven pair experiences a crossover, regardless of whether the victim pair experiences a crossover or not.

As shown in Table II, this arrangement of conductors can reciprocally compensate the differential to common mode crosstalk for all pair combinations. For example, differential to common mode crosstalks between (a) pair 1 and pair 2 and vice versa and (b) pair 1 and pair 4 and vice versa are compensated by the crossovers present in these pairs. Also, common mode crosstalk induced on all of the other pairs by pair 3 can be compensated by the dual crossovers in pair 3.

TABLE II

Differential to Common Mode Coupling Polarities

|  | Region I | Region II | Region III | Region IV |
| --- | --- | --- | --- | --- |
| Pair 1-Pair 1 | positive | positive | negative | negative |
| Pair 1-Pair 2 | negative | negative | positive | positive |
| Pair 1-Pair 3 | negative | negative | positive | positive |
| Pair 1-Pair 4 | positive | positive | negative | negative |
| Pair 2-Pair 1 | negative | negative | positive | positive |
| Pair 2-Pair 2 | negative | negative | positive | positive |
| Pair 2-Pair 3 | negative | negative | positive | positive |
| Pair 2-Pair 4 | negative | negative | positive | positive |
| Pair 3-Pair 1 | positive | negative | negative | positive |
| Pair 3-Pair 2 | positive | negative | negative | positive |
| Pair 3-Pair 3 | negative | positive | positive | negative |
| Pair 3-Pair 4 | negative | positive | positive | negative |
| Pair 4-Pair 1 | positive | positive | negative | negative |
| Pair 4-Pair 2 | positive | positive | negative | negative |
| Pair 4-Pair 3 | positive | positive | negative | negative |
| Pair 4-Pair 4 | positive | positive | negative | negative |

Moreover, the cancellation of differential to common mode crosstalk from each of the four pairs unto itself (e.g., pair 1-pair 1, pair 2-pair 2) can reduce the generation of and susceptibility to electromagnetic interference.

Those skilled in this art will appreciate that the conductors may take many forms, including contact wires, leadframe structures, traces on a wiring board, and combinations of such components. Examples of conductors, and particularly combinations of components that form conductors, are described below. Other forms of conductors may also be employed. Also, the "crossovers" of the conductors can be achieved via techniques known to those skilled in this art, such as (a) contact wires and leadframe structures physically crossing one another in a non-contacting manner, such that a portion of one conductor of a pair prior to a crossover is aligned with a portion of the other conductor of the pair after the crossover and (b) conductive traces crossing paths on different layers of a wiring board.

An exemplary implementation of this concept in a communications jack is illustrated in FIGS. 2–7*f*. The jack 10 includes a jack frame 12 having a plug aperture 14 for receiving a mating plug, a cover 16 and a terminal housing 18. These components are conventionally formed and not need be described in detail herein; for a further description of these components and the manner in which they interconnect, see U.S. Pat. No. 6,350,158 to Arnett et al., the disclosure of which is hereby incorporated herein in its entirety. Those skilled in this art will recognize that other configurations of jack frames, covers and terminal housings may also be employed with the present invention. Exemplary configurations are illustrated in U.S. Pat. Nos. 5,975, 919 and 5,947,772 to Arnett et al. and U.S. Pat. No.

6,454,541 to Hashim et al., the disclosures of each of which are hereby incorporated herein in its entirety.

Figure 2:
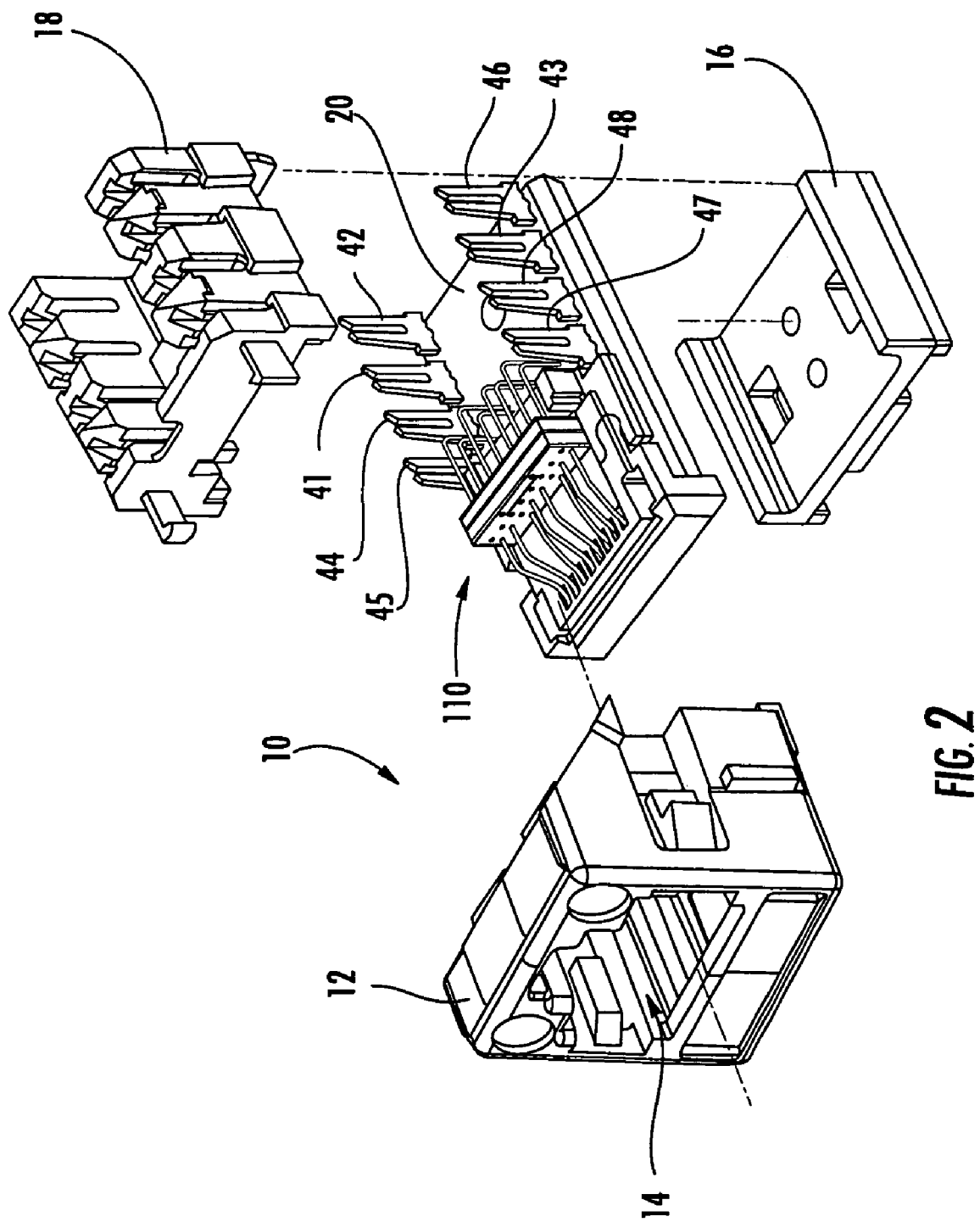
FIG. 2 is a perspective view of a communications jack that includes the conductors of FIG. 1 according to embodiments of the present invention.
Figure 3:
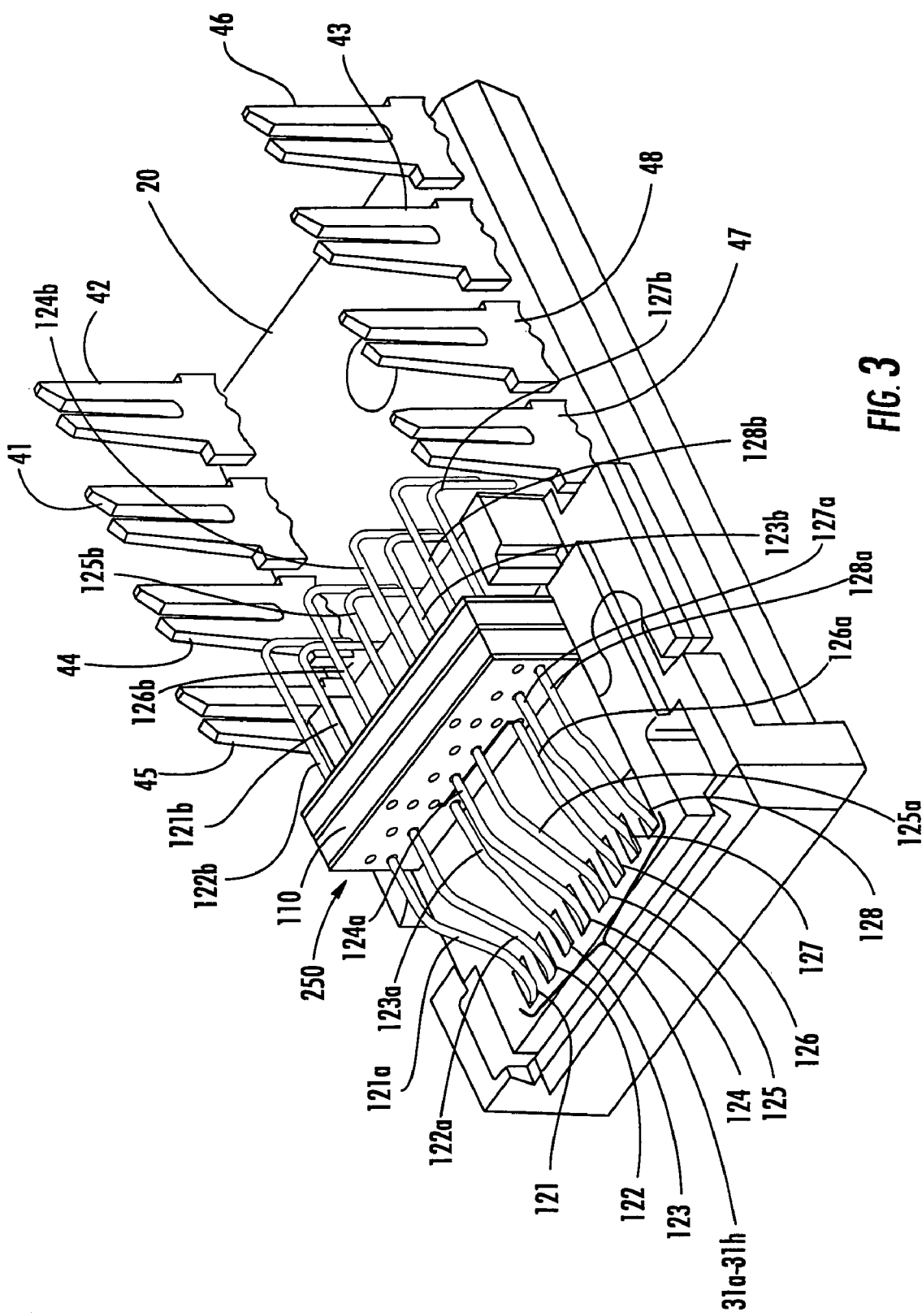
FIG. 3 is an enlarged perspective view of the wiring boards and conductors of the communications jack of FIG. 2.
Figure 5:
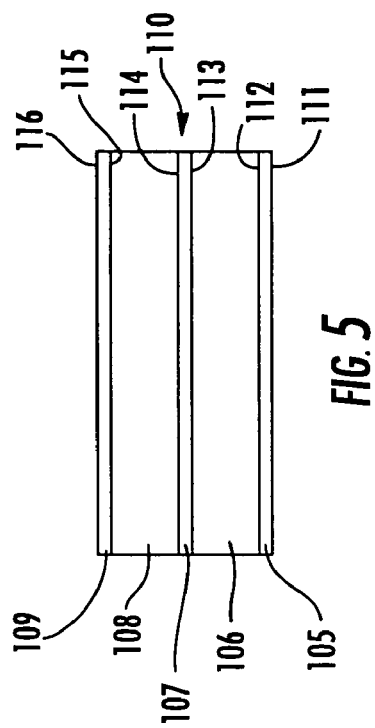
FIG. 5 is a top view of the floating PWB of FIG. 3 showing the conductive and insulative layers.
Figure 4:
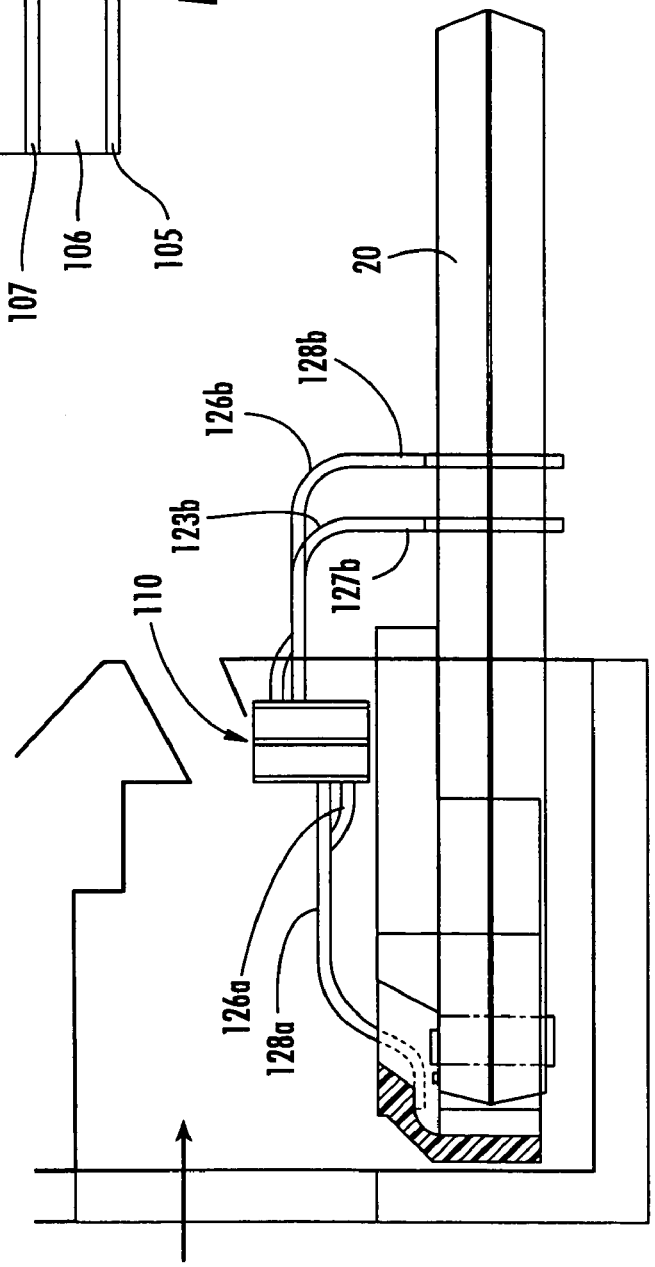
FIG. 4 is a side view of the wiring boards and conductors of FIG. 3.
Figure 6:
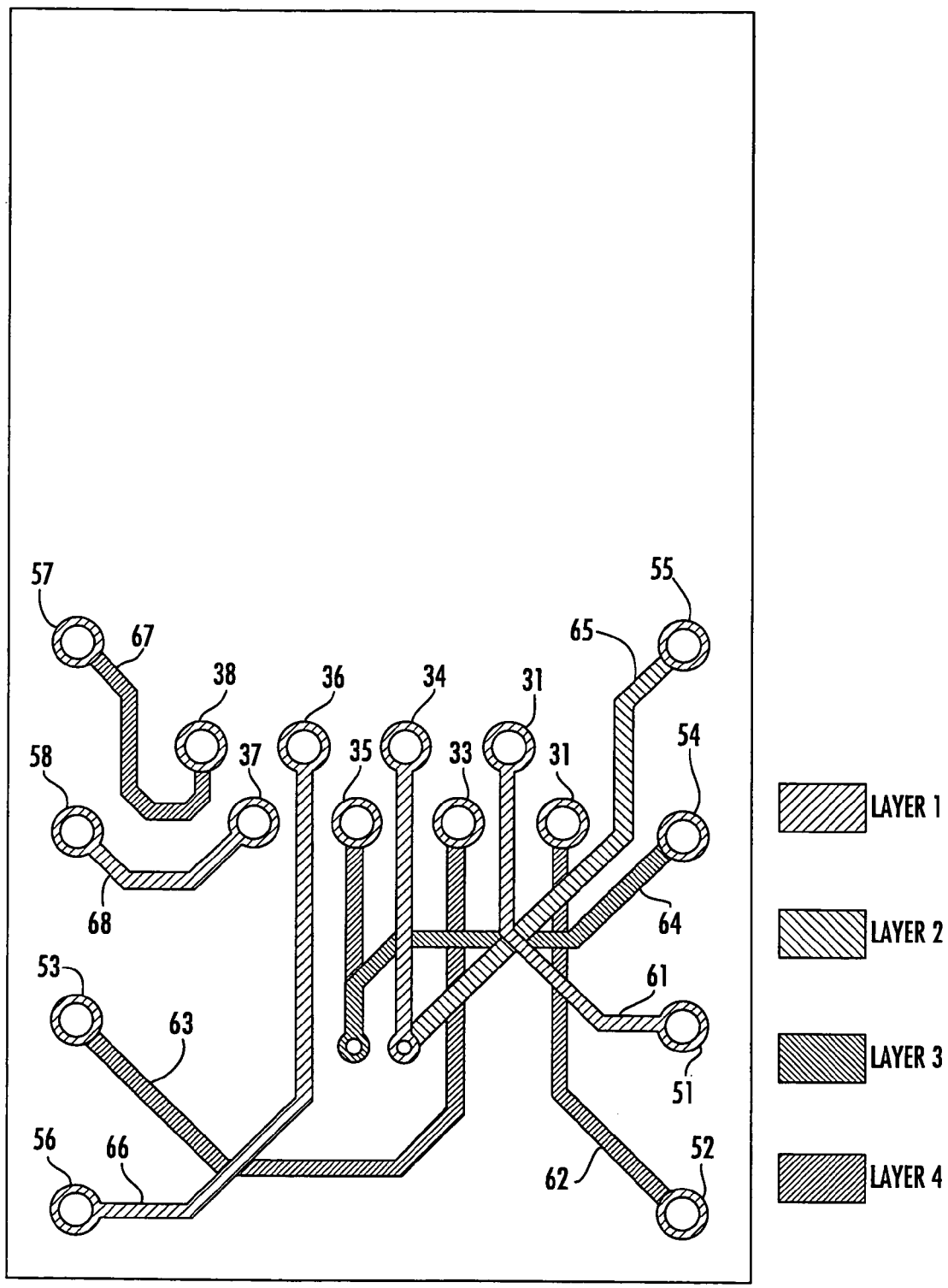
FIG. 6 is a top view of the wiring board and traces deposited thereon of the jack of FIG. 2.

In addition, referring still to FIG. 2 and also to FIGS. 3, 4 and 6, the jack 10 further includes a wiring board 20 or other dielectric mounting substrate formed of conventional materials. The wiring board 20 may be a single layer board or may have multiple layers. The wiring board 20 may be substantially planar as illustrated, or may be non-planar. The wiring board 20 serves as a mounting location for eight conductors 121–128, which are described in greater detail below. The conductors 121–128 are mounted to the wiring board 20 via insertion into apertures 31–38 (see FIG. 6), which are arranged in the illustrated embodiment in a staggered pattern known to those skilled in this art as described in U.S. Pat. No. 6,116,964 to Goodrich et al., the disclosure of which is hereby incorporated herein in its entirety. Those skilled in this art will appreciate that conductors of other configurations may be used. As one example, contact wires configured as described in aforementioned U.S. Pat. No. 5,975,919 to Arnett et al. may be employed.

Referring once again to FIGS. 2, 3 and 6, eight insulation displacement connectors (IDCs) 41–48 are inserted into eight respective IDC apertures 51–58 on the wiring board 20. The IDCs are of conventional construction and need not be described in detail herein; exemplary IDCs are illustrated and described in U.S. Pat. No. 5,975,919 to Arnett, the disclosure of which is hereby incorporated by reference herein in its entirety.

Referring again to FIG. 6, each of the wire apertures 31–38 is electrically connected to a one of the IDC apertures 51–58 via one of the traces 61–68, thereby interconnecting each of the conductors 121–128 to a corresponding IDC 41–48. The traces 61–68 are formed of conventional conductive materials and are deposited on the wiring board 20 via any deposition method known to those skilled in this art to be suitable for the application of conductors. Some traces are illustrated as being entirely present on a single layer of the wiring board 20 (for example, trace 61), while other traces (for example, trace 65) may reside on multiple layers of the wiring board 20; traces can travel between layers through the inclusion of vias (also known as plated through-holes) or other layer-transferring structures known to those skilled in this art.

Referring now to FIGS. 3 and 4, each of the conductors 121–128 includes a free end segment 121a–128a and a fixed end segment 121b–128b. The free end segments 121a–128a are generally parallel in profile, are substantially transversely aligned in side-by-side relationship, and extend into the plug aperture 14 to form electrical contact with the terminal blades of a mating plug. As used herein, "generally parallel" with reference to the free end portions means that, from the vantage point of FIG. 4, substantial portions of the free end portions are parallel to one another. The ends of the free end segments 121a–128a extend into individual slots 31a–31h in the forward edge portion of the wiring board 20 and extend rearwardly to mount in the front surface of a printed wiring board (PWB) 110. The fixed end segments 121b–128b extend from the rear surface of the PWB 110 to insert into respective apertures 31–38 in the wiring board 20 (shown in FIG. 6). The fixed end segments may be aligned or non-aligned with the free end segments. Conductors that are "aligned" have free and fixed ends that are substantially collinear in top view (i.e., from the vantage point of FIG. 1 or FIG. 8a), and conductors that are "non-aligned" have free and fixed ends that are not substantially collinear in top view.

Referring again to FIGS. 3 and 4, the PWB 110 is disposed above the upper surface of the wiring board 20. The PWB 110 can be rigid or flexible and is typically formed of a dielectric material. The PWB 110 is suspended above the wiring board 20 by the conductors 121–128 and is generally perpendicular to the wiring board 20 and the conductors 121–128. In the illustrated embodiment, the lower edge of the PWB 110 is spaced apart from the upper surface of the wiring board 20, such that the PWB 110 is free to move upon deflection of the conductors 121–128 (as when a mating plug is inserted into the jack 10), although in some embodiments the lower edge of the PWB 110 may contact the wiring board 20. The distance between the PWB 110 and the locations where are separated from the conductors 121–128 intercept a mating plug is about 0.154 inches, but those skilled in this art will appreciate that a different distance may also be suitable with the present invention. Typically the PWB 110 is positioned between about 0.3 and 0.4 inches from the free ends of the conductors 121–128.

Referring now to FIGS. 5 and 7a–7f, the PWB 110 includes six layers 111–116 on which conductive traces are deposited; five insulating layers 105–109 are disposed between the six layers 111–116. The PWB 110 also includes twenty bores divided into four rows. Eight bores 151a–158a are aligned in one row, and eight bores 151b–158b are aligned in a second row above the bores 151a–158a. Two bores 153c, 156c form a row below the bores 151a–158a, with the bore 153c below the bore 153a and the bore 156c below the bore 156a, and two bores 153d, 156d form a row above the bores 151b–158b, with the bore 153d above the bore 153b and the bore 156d above the bore 156b.

As can be seen in FIG. 3, the segments 121a–128a of the conductors 121–128 extend from the forward end of the wiring board 120 to the PWB 110. At the PWB 110, the segments 121a, 122a, 124a, 125a, 127a and 128a are inserted into the bores 151a, 152a, 154a, 155a, 157a and 158a, respectively. The segments 123a, 126a are inserted into, respectively, the bores 153c, 156c.

Figure 7A:
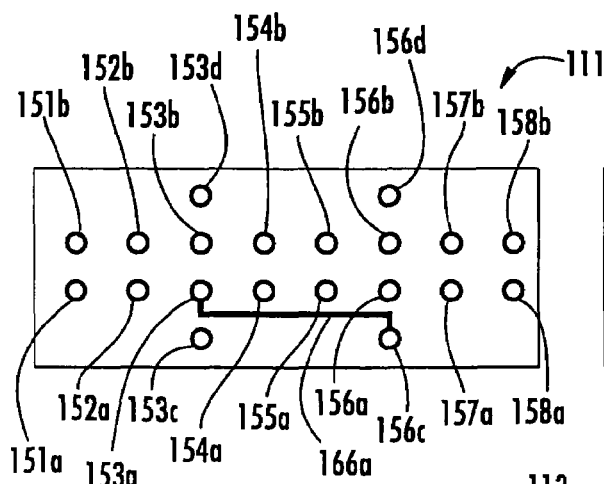
FIGS. 7a–7f are front views of the layers of the floating PWB of the jack of FIG. 2.
Figure 7B:
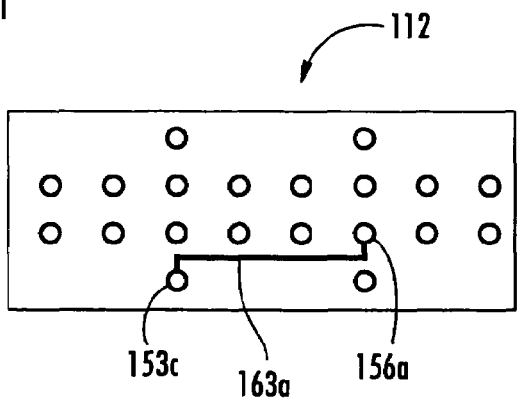

Referring now to FIG. 7a, which shows the layer 111 of the PWB 110, a trace 166a is deposited thereon and extends between the bore 156c and the bore 153a. As a result, the segment 126a of conductor 126 is electrically connected to the bore 153a. No other traces are present on the layer 111. As is shown in FIG. 7b, the layer 112 includes a trace 163a that extends between the bore 153c and the bore 156a. Consequently, the segment 123a of the conductor 123 is electrically connected to the bore 156a. No other traces are present on the layer 112. Combining layers 111 and 112, it can be seen that the conductors 123, 126 have undergone, via the traces 163a, 166a, a crossover. This crossover corresponds to the crossover between regions I and II in the arrangement illustrated in FIG. 1.

Figure 7C:
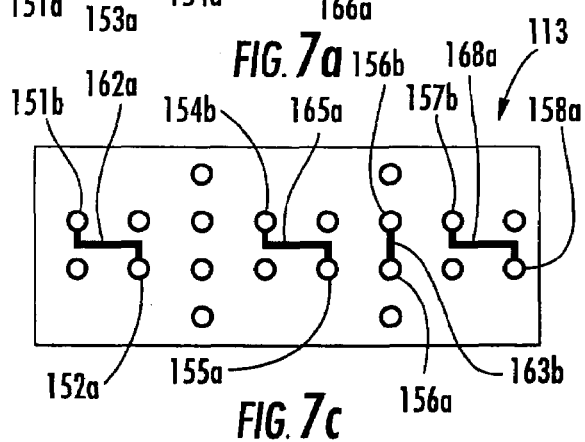

Referring now to FIG. 7c, the layer 113 includes four traces. A trace 162a extends between the bore 152a and the bore 151b, thereby electrically connecting the conductor segment 122a to the bore 151b. A trace 165a extends between the bore 155a and the bore 154b, which electrically connects the conductor segment 125a with bore 154b. A trace 168a extends between the bore 158a and the bore 157b to connect the conductor segment 128a with the bore 157b. A trace 163b extends between the bore 156a and the bore 156b to connect the bore 156a (which is connected with the conductor segment 123a) with the bore 156b.

Figure 7D:
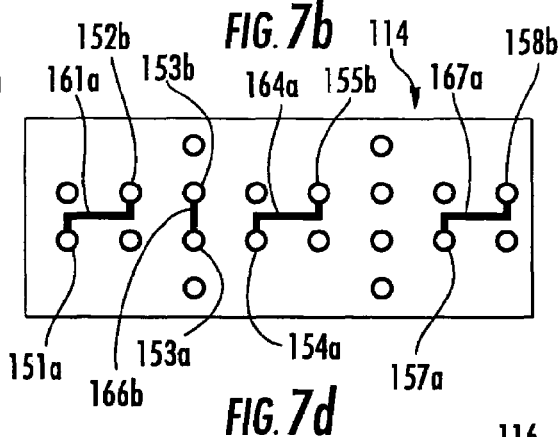

Turning now to FIG. 7d, the layer 114 includes four traces. A trace 161a extends between the bore 151a and the bore 152b, thereby electrically connecting the conductor segment 121a to the bore 152b. A trace 164a extends between the bore 154a and the bore 155b, which electrically connects the conductor segment 124a with bore 155b. A trace 167a extends between the bore 157a and the bore 158b to connect the conductor segment 127a with the bore 158b. A trace 166b extends between the bore 153a and the bore 153b to connect the bore 153a (which is connected with the conductor segment 126a) with the bore 153b.

Combining FIGS. 7c and 7d, it can be seen that the conductors 121 and 122 have undergone a crossover (via traces 161a and 162a), conductors 124 and 125 have undergone a crossover (via traces 164a and 165a), and conductors 127 and 128 have undergone a crossover (via traces 167a and 168a). These crossovers correspond to the crossovers between regions II and III illustrated in FIG. 1.

Figure 7E:
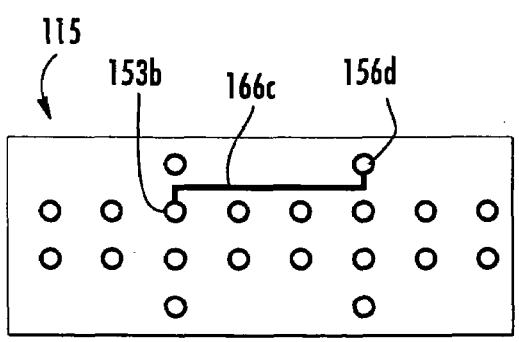
Figure 7F:
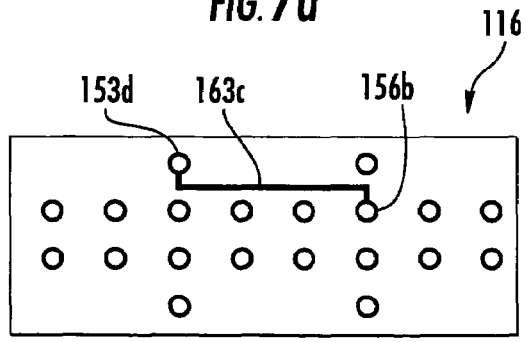

Referring now to FIG. 7e, which shows the layer 115, a trace 166c is deposited thereon and extends between the bore 153b and the bore 156d. As a result, the segment 126a of conductor 126 is electrically connected to the bore 156d through the bores 156c, 153a, and 153b. No other traces are present on the layer 115. As is shown in FIG. 7f, the layer 116 includes a trace 163c that extends between the bore 156b and the bore 153d. Consequently, the segment 123a of the conductor 123 is electrically connected to the bore 153d via bores 153c, 156a and 156b. No other traces are present on the layer 116. Combining layers 115 and 116, it can be seen that the conductors 123, 126 have undergone a crossover via the traces 163c, 166c that corresponds to the crossover between regions III and IV illustrated in FIG. 1.

Finally, the conductor segments 121b, 122b, 124b, 125b, 127b and 128b are inserted, respectively, into the bores 152b, 151b, 155b, 154b, 158b and 157b. Thus, the conductors 121, 122, 124, 125, 127 and 128 are electrically connected from their free ends to their mounting locations on the wiring board 20 (where they connect with the traces 61, 62, 64, 65, 67 and 68). The conductor segments 123b, 126b are inserted into the bores 153d, 156d, respectively, to complete the electrical connection of the conductors 123, 126 between their free ends and their mounting locations on the wiring board 20 via the traces 63, 66. Between the PWB 110 and the wiring board 20, the segments 121b–128b converge into a co-planar geometry, thus forming region IV of FIG. 1.

It can be seen that the conductors 121–128, by virtue of their interconnection through the PWB 110, in conjunction with the geometrical arrangement of their segments 121a–128a and 121b–128b, include the crossovers and coupling regions illustrated in FIG. 1. As such, the jack 10 can enjoy the improved performance that can be achieved with such a configuration.

Those skilled in this art will recognize that the illustrated PWB 110 may take other configurations. As one example, the bores may be arranged in staggered, rather than aligned, rows. As another example, the PWB may be subdivided into three separate PWBs, with the layers 111, 112 on the opposite sides of one PWB, the layers 113, 114 on a second PWB, and the layers 115, 116 on a third PWB. Alternatively, two separate PWBs may be employed, with four layers of traces being present on one PWB and two layers of traces on the other. In addition, the crossovers may be achieved through different layouts of traces on the PWB, which may or may not utilize different numbers of layers on the PWB.

Another example of an embodiment of a jack with a different PWB configuration is illustrated in FIGS. 8 and 9a–9f. The jack shown therein is designated broadly at 200 and includes conductors 221–228 of the same configuration as described above in connection with the jack 10 with the exception of the PWB 210 in the manner described below.

The PWB 210 includes six separate layers 211, 212, 213, 214, 215 and 216; five insulating layers 205–209 are disposed between the six layers 211–216 (FIGS. 8 and 9a–9f). The PWB 210 also includes thirty-six bores divided into six rows. Eight bores 251a–258a are aligned in one row, and eight bores 251b–258b are aligned in a second row immediately below the bores 251a–258a. Two bores 253c, 256c form a row immediately below the bores 251b–258b, with the bore 253c below the bore 253b and the bore 256c below the bore 256a, and two bores 253d, 256d form a row below the bores 253c, 256c. Eight bores 251e–258e form a row immediately below the bores 253d, 256d. Finally, eight bores 251f–258f form a row immediately below the bores 251e–258e.

Free end segments 221a–228a of the conductors 221–228 extend from the forward end of the wiring board 220 to the PWB 210 (see FIG. 8a). At the PWB 210, the segments 221a, 222a, 224a, 225a, 227a and 228a are inserted into the bores 251e, 252e, 254e, 255e, 257e and 258e, respectively. The segments 223a, 226a are inserted into, respectively, the bores 253d, 256d.

Referring first to FIG. 9a, which shows the layer 211, a trace 263a is deposited thereon and extends between the bore 253d and the bore 256e. As a result, the segment 223a of conductor 223 is electrically connected to the bore 256e. No other traces are present on the layer 211.

Referring now to FIG. 9b, which shows the layer 212, a trace 266a is deposited thereon and extends between the bore 256d and the bore 253e. The trace 266a electrically connects segment 226a with the bore 253e. The combination of the trace 263a and the trace 266a form a crossover corresponding to the crossover between regions I and II illustrated in FIG. 1. The layer 212 also includes the eight traces 261a, 262a, 266b, 264a, 265a, 263b, 267a, 268a that extend between, respectively, the bores 251e–258e and 251f–258f, thus forming the first part of region II of FIG. 1, with the second part formed by the portions of the bores 251f–258f traversing the insulating layer 206.

Turning now to FIG. 9c, the layer 213 includes a trace 262b, which extends between the bore 252f and the bore 251a, a trace 265b, which extends between the bore 255f and the bore 254a, and a trace 268b, which extends between the bore 258f and the bore 257a. In addition, the layer 213 includes a trace 263c, which extends between the bore 256f and the bore 256a.

FIG. 9d illustrates the layer 214, which includes a trace 261b, which extends between the bore 251f and the bore 252a, a trace 264b, which extends between the bore 254f and the bore 255a, and a trace 267b, which extends between the bore 257f and the bore 258a. The layer 214 also includes a trace 266c, which extends between the bore 253f and the bore 253a.

Combining layers 213 and 214 demonstrates that the traces 261b and 262b form a crossover, the traces 264b and 265b form a crossover, and the traces 267b, 268b form a crossover. These crossovers correspond to the crossovers of the conductors of pairs 1, 2 and 4 between regions II and III shown in FIG. 1.

Referring now to FIG. 9e, the layer 215 includes a trace 263e that extends between the bore 256b and the bore 253c. The layer 215 also includes eight traces 262c, 261c, 266d, 265c, 264c, 263d, 268c, 267c that extend between, respectively, the bores 251b–258b and the bores 251a–258a, thus forming the second part of region III of FIG. 1, with the first part formed by the portions of the bores 251a–258a traversing the insulating layer 208.

Turning now to FIG. 9f, the layer 216 includes a single trace 266e that extends between the bore 253b and the bore 256c. The traces 263e and 266e from a crossover that corresponds to that shown between regions III and IV in FIG. 1.

The conductor segments 222b, 221b, 225b, 224b, 228b and 227b are inserted into, respectively, the bores 251b, 252b, 254b, 255b, 257b and 258b (see FIG. 8a). The conductor segments 223b and 226b are inserted into, respectively, the bores 253c and 256c. The segments 221b–228b converge into a co-planar geometry, thus forming region IV of FIG. 1, and their fixed ends are mounted in the wiring board 220 in apertures located thereon.

The configuration illustrated in FIGS. 8, 8a and 9a–9f includes the single crossovers of pairs 1, 2 and 4 and dual crossovers of pair 3 shown in FIG. 1, and can achieve the performance advantages of such a configuration. However, by providing increased distance to regions "II" and "III" via increasing the lengths of the traces in layers 213 and 214, the effective compensating lengths (i.e., the lengths of mutual inductance between conductors) of the regions I–IV are more nearly the same. As such, the efficiency of crosstalk compensation of the jack 200 may be improved.

In order to increase the length of regions II and III in the manner shown, the PWB 210 may need to be somewhat taller relative to the wiring board 220. Because function typically restricts the height of jacks somewhat, a PWB of the configuration illustrated in FIGS. 8, 8a and 9a–9f that has conductor lengths that are approximately equal may have excessive height. To address this issue, the wiring board 220 may be formed with an aperture 275 that is sized to enable the PWB 210 to descend therein (see FIG. 8). When a mating plug is inserted in the jack that causes the conductors 221–228 to deflect downwardly, the PWB 210 is able to descend into the aperture 275 without interference.

Figure 10:
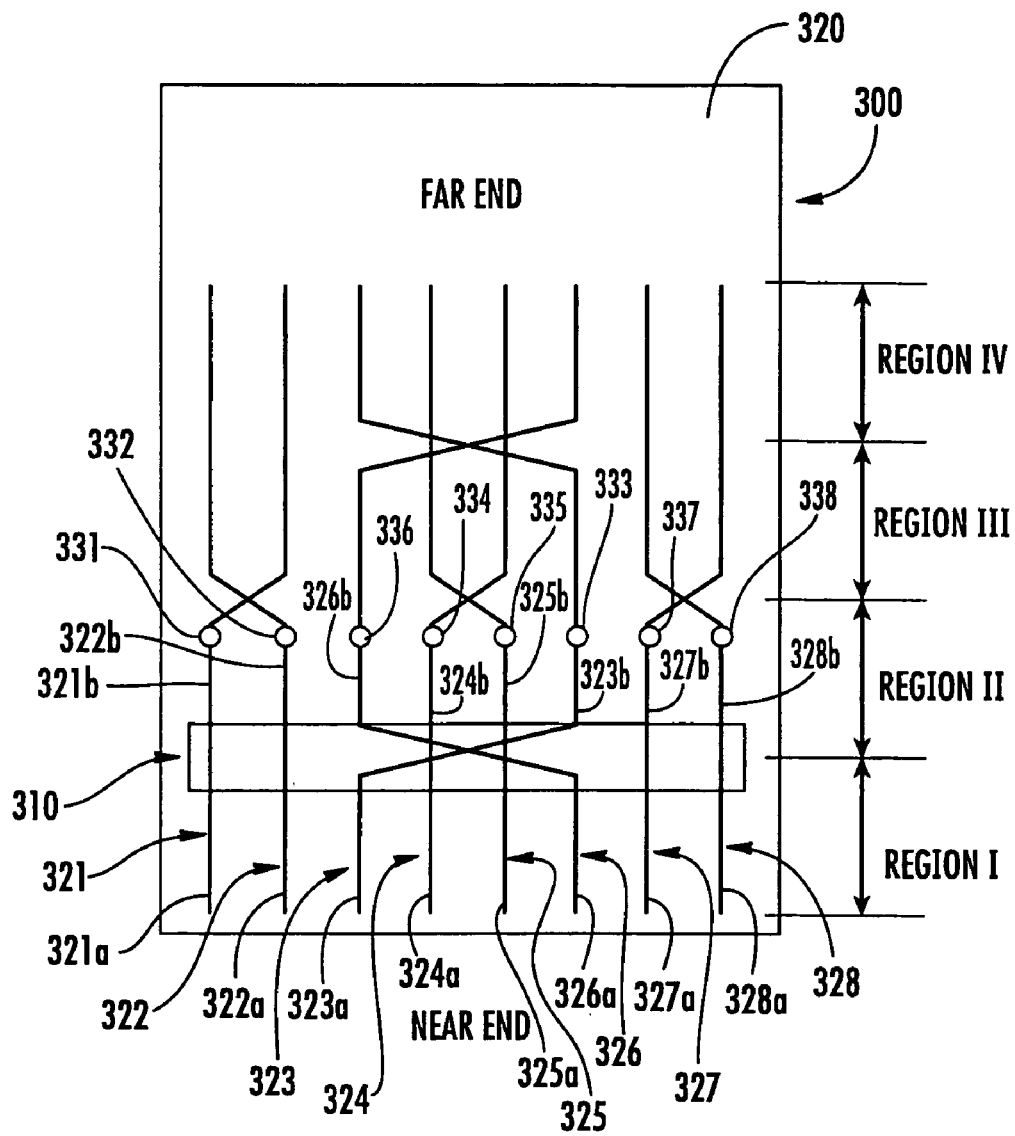
FIG. 10 is a top schematic view of a communications jack according to additional embodiments of the present invention.

The ordinarily skilled artisan will understand that in some embodiments of the present invention, some of the crossovers of conductors between regions may be implemented in different forms. For example, FIG. 10 schematically illustrates a jack, designated broadly at 300, that includes a floating PWB 310 with the crossover of the conductors of pair 3 created by traces deposited thereon, and further includes a wiring board 320 with conductive traces that create (a) crossovers between the conductors of pairs 1, 2 and 4 and (b) the second crossover between the conductors of pair 3. The structures of these components are discussed below.

Figure 11A:
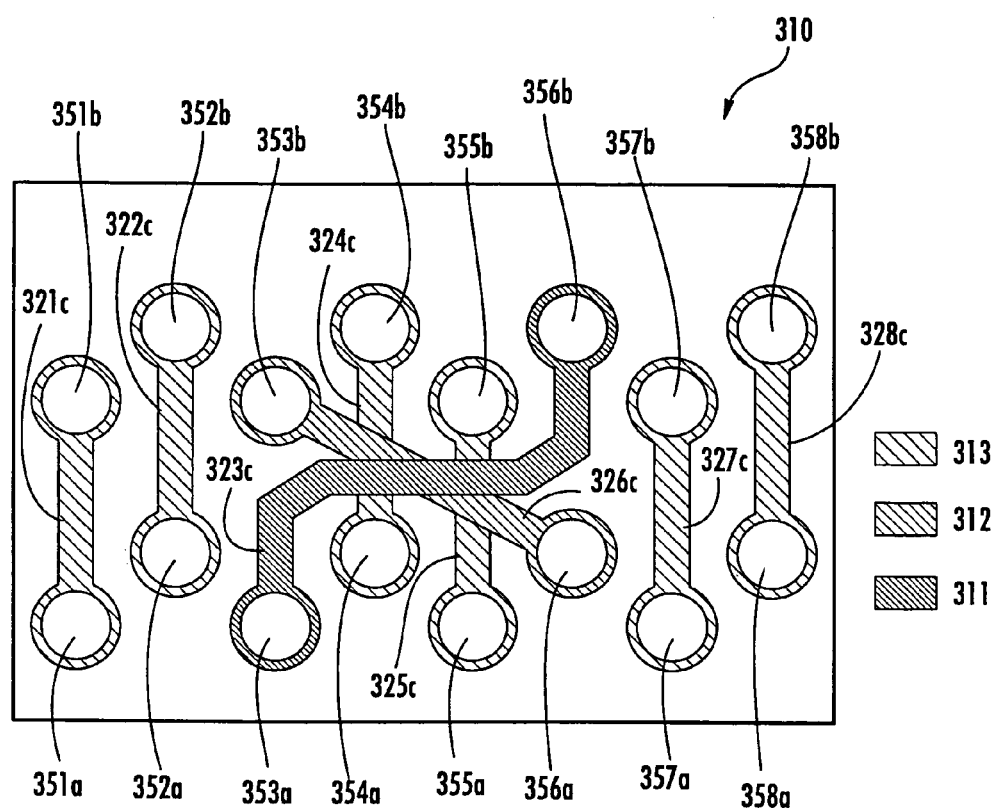
FIG. 11a is a front view of the floating PWB of the jack of FIG. 10.

Referring to FIGS. 10 and 11a, the PWB 310 includes three layers 311–313 on which conductive traces are deposited. Also, the PWB 310 includes sixteen bores 351a–358a, 351b–358b arranged in two staggered rows. Conductors 321–328 include approaching segments 321a–328a that are inserted into, respectively, the bores 351a–358a. Exiting segments 321b, 322b, 324b, 325b, 327b, 328b are inserted into bores 351b, 352b, 354b, 355b, 357b, 358b, respectively. Exiting segments 323b, 326b are inserted into bores 356b, 353b, respectively. The exiting segments 321b–328b are mounted on the wiring board 320 in respective apertures 331–338.

As can be seen in FIGS. 11, the layer 311 of the PWB 310 includes a trace 323c that is routed between the bores 353a and 356b. The layer 312 of the PWB 310 includes a trace 326c that is routed between the bores 356a and 353b. Thus, a crossover in the conductors 323, 326 of pair 3 is created by the traces 323c, 326c that corresponds to the crossover in FIG. 1 between regions I and II.

In addition, on layer 313 of the PWB 310, six traces 321c, 322c, 324c, 325c, 327c, 328c extend between, respectively, the bores 351a, 352a, 354a, 355a, 357a, 358a and the bores 351b, 352b, 354b, 355b, 357b, 358b. These traces connect the approaching segments 321a, 322a, 324a, 325a, 327a, 328a with the exiting segments 321b, 322b, 324b, 325b, 327b, 328b of the conductors 321, 322, 324, 325, 327, 328. The exiting segments 221b–228b converge into a co-planar geometry, thus forming region II of FIG. 1.

An alternative configuration for providing the pair 3 crossover between regions I and II is shown in FIG. 11b. In this method the pair 3 conductors 1003, 1006 are physically crossed in lieu of using a floating board in a manner similar to the embodiments of co-pending and co-assigned U.S. patent application Ser. No. 11/044,088 (the '088 application), filed Mar. 25, 2005.

Figure 12:
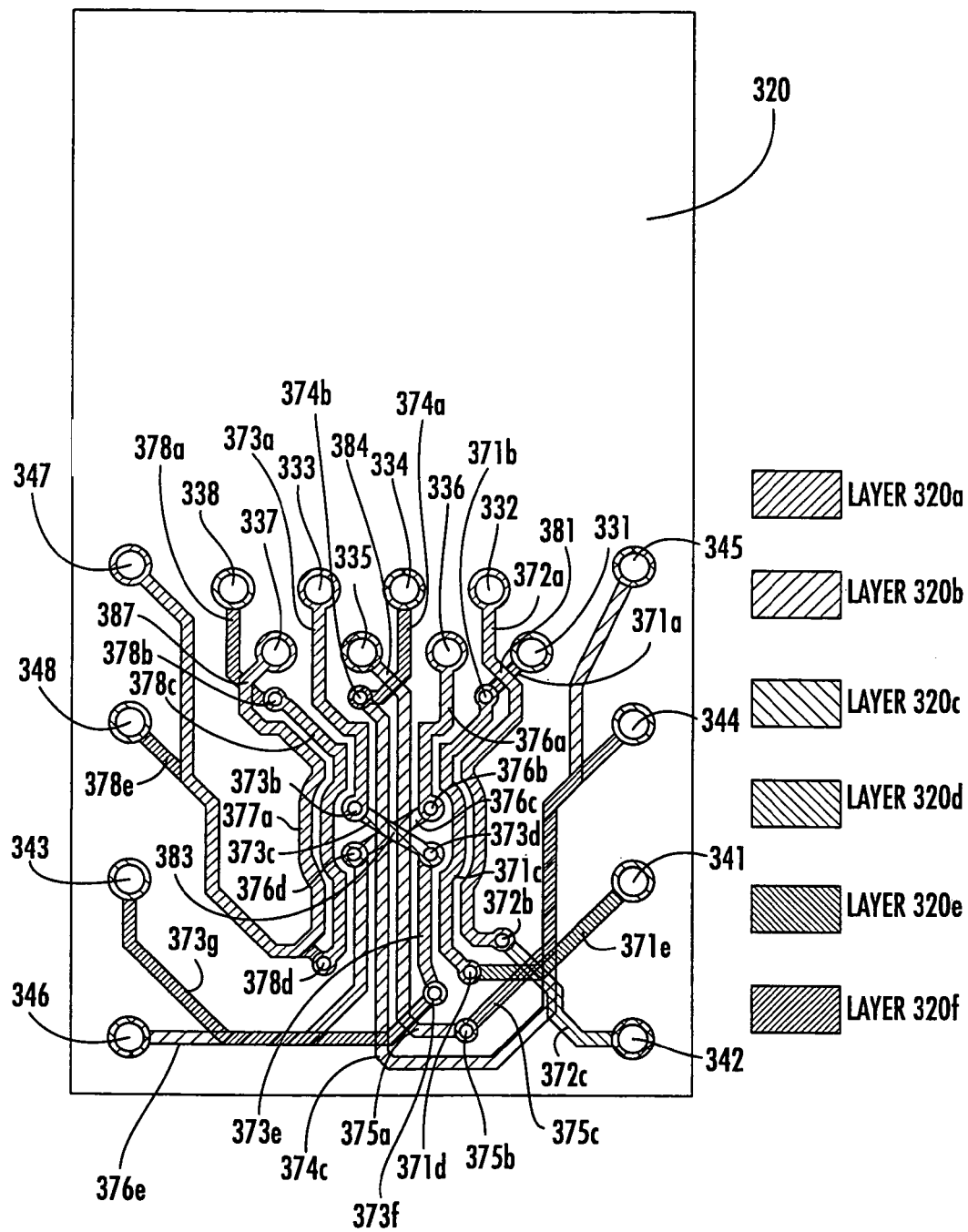
FIG. 12 is a top view of the layers of the wiring board of the jack of FIG. 10

Referring now to FIG. 12, the wiring board 320 includes six overlying layers 320a–320f, each of which includes conductive traces of the conductors 321–328. Beginning with the conductors 327, 328 of pair 2, a conductive trace 378a is located on layer 320f and extends away from aperture 338 to a via 378b. A trace 378c is located on layer 320a and extends between the via 378b and another via 378d. A trace 378e extends from the via 378d to an aperture 348, in which an IDC is mounted. Thus, the traces 378a, 378c, 378e and the vias 378b, 378d connect the exiting segment 328b (and, in turn, the entirety of the conductor 328) to the IDC. In addition, a conductive trace 377a follows a serpentine path in traveling between the aperture 337 and the aperture 347, in which an IDC is mounted. Notably, the trace 377a crosses above the trace 378a at a crossover 387, thereby creating the crossover between the conductors 327, 328 of pair 2 between regions II and III illustrated in FIG. 1.

Turning next to the conductors 324, 325 of pair 1, a trace 375a is located on layer 320a and extends from aperture 335 to a via 375b. A trace 375c located on layer 320f travels from the via 375b to an aperture 344 that serves as a mounting location for an IDC. Thus, the traces 375a, 375c and the via 375b combine to connect the exiting segment 325b of the conductor 325 to the IDC. A trace 374a is located on layer 320f and travels from the aperture 334 to a via 374b; in doing so, the trace 374a passes below (and therefore forms a crossover 384 with) the trace 375a. A serpentine trace 374c is routed from the via 374b to an aperture 345 in which an IDC is mounted. The crossover 384 corresponds to the crossover of the conductors of pair 1 between regions II and III shown in FIG. 1.

Following now the conductors of pair 4, a trace 372a on layer 320a extends from the aperture 332 to a via 372b. A trace 372c located on the layer 320d extends from the via 372b to an aperture 342, in which an IDC is mounted. As a result, the exiting segment 322b (and in turn the entirety of the conductor 322) is connected with the IDC. Also, a trace 371a extends from the aperture 331 to a via 371b; in following this path, the trace 371a passes under the trace 372a, thereby forming a crossover 381 that corresponds to the crossover of the conductors of pair 4 between regions II and III shown in FIG. 1. A trace 371c located on layer 320a is routed from the via 371b to another via 371d. Another trace 371e is located on layer 320d and travels between the via 371d and an aperture 341 in which an IDC is mounted. Thus, the traces 371a, 371c, 371e and the vias 371b, 371d connect the exiting segment 321b of the conductor 321 to the IDC.

Finally, turning to the conductors 323, 326 of pair 3, a trace 373a located on the layer 320a extends between the aperture 333 and a via 373b. A trace 373c located on the layer 320c extends between the via 373b and a via 373d and, in doing so, passes below the traces 374c and 375a of the conductors 374, 375 of pair 1. A trace 373e located on layer 320a extends between the via 373d and a via 373f. A trace 373g located on layer 320f extends between the via 373f and the aperture 343, in which an IDC is mounted. Thus, the exiting segment 323b of the conductor 323 is connected with the IDC via the traces 373a, 373c, 373e, 373g and the vias 373b, 373d, 373f. A trace 376a located on the layer 320a extends from the aperture 336 to a via 376b. A trace 376c located on layer 320b extends from the via 376b to a via 376d; in doing so, the trace 376c passes below the 374c and 375a of the conductors 374, 375 of pair 1, and also forms a crossover with the trace 373c of the conductor 373. As a result, the conductors 373, 376 form a crossover 383 that corresponds to the crossover of the conductors of pair 3 between regions III and IV shown in FIG. 1. A trace 376e travels from the via 376d to an aperture 346 in which is mounted an IDC. Therefore, the traces 376a, 376c, 376e and the vias 376b, 376d connect the exiting segment 326b of the conductor 326 with the IDC.

Notably, the portions of the traces of the conductors between the crossover points 381, 384, 387 and the crossover 383 include generally parallel segments that are all located on the same layer (layer 320a) of the wiring board 320, as do the portions of the traces following the crossover 383. These parallel portions correspond to regions III and IV of FIG. 1, thus enabling the compensation of crosstalk between the conductors as described above. Because the traces on a wiring board can typically be formed closer together than leadframe or contact wire-type conductors, they may be able to compensate crosstalk more efficiently (i.e., over a shorter length), which can assist in keeping the jack compact.

Referring now to FIGS. 13–16, another embodiment of a connector of the present invention, designated broadly at 400, is illustrated therein. The connector 400 includes a wiring board 420, a PWB 410, and eight conductors 421–428. The conductors 421–428 have respective approaching segments 421a–428a that extend from the forward end of the wiring board 420 to the PWB 410, and further have exiting segments 421b–428b that extend from the PWB 410 to mounting locations 431–438 on the wiring board 420. Crossovers between (a) regions I and II and (b) regions II and III occur in the PWB 410, and a crossover between regions III and IV occurs in the wiring board 420.

Figure 13:
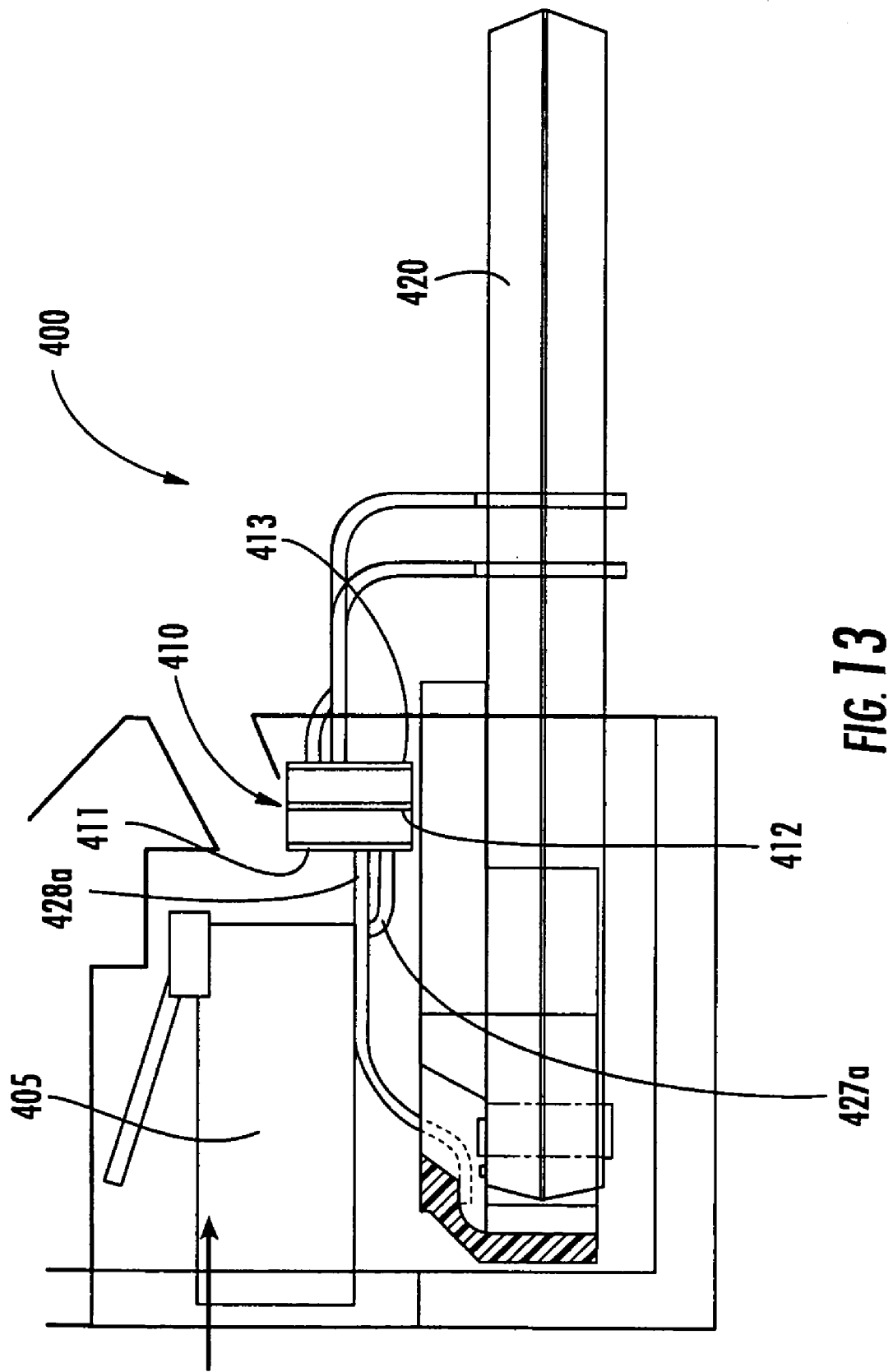
FIG. 13 is a side view of a communications jack according to further embodiments of the present invention.
Figure 14:
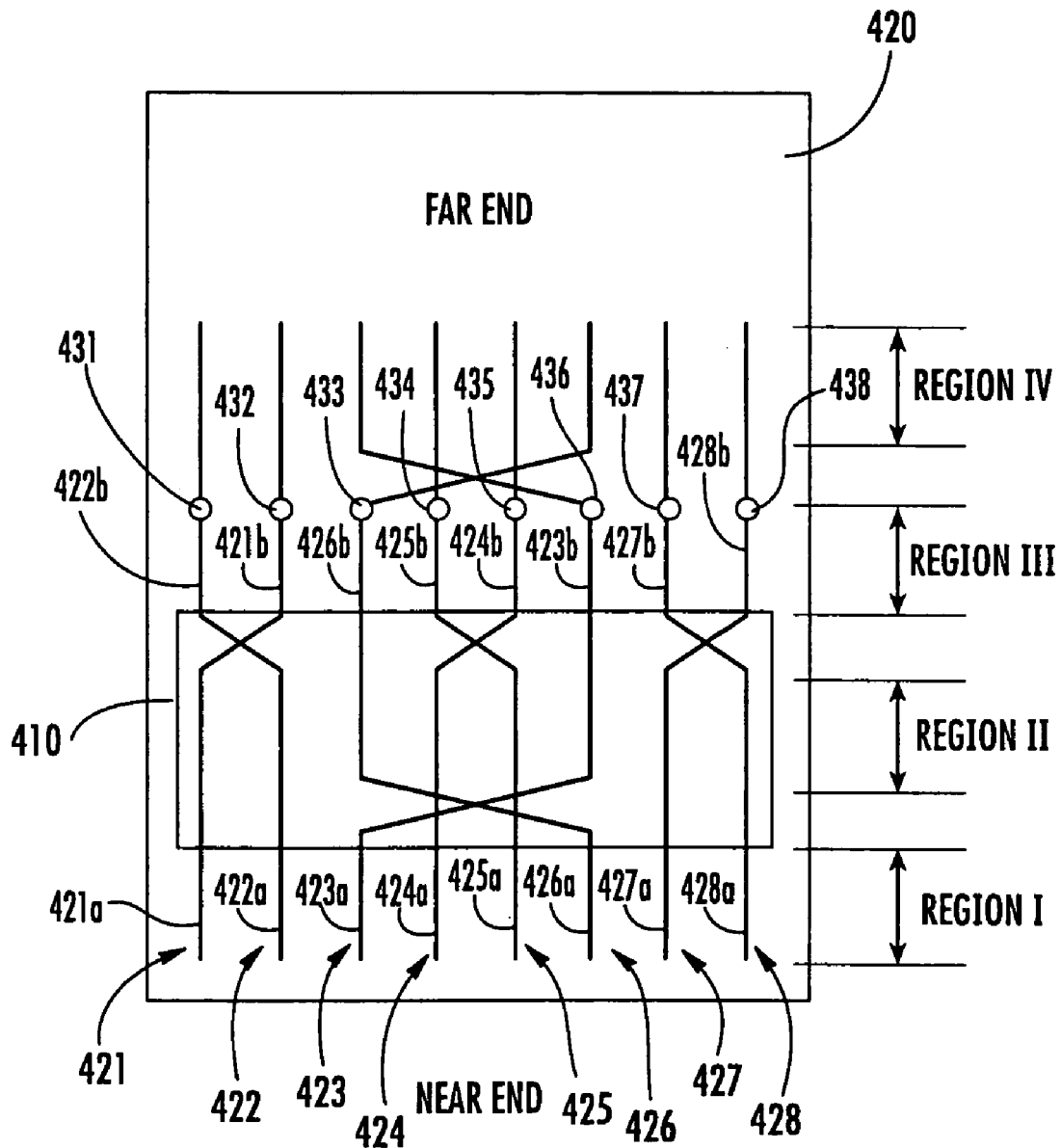
FIG. 14 is a schematic top view of the jack of FIG. 13.
Figure 15:
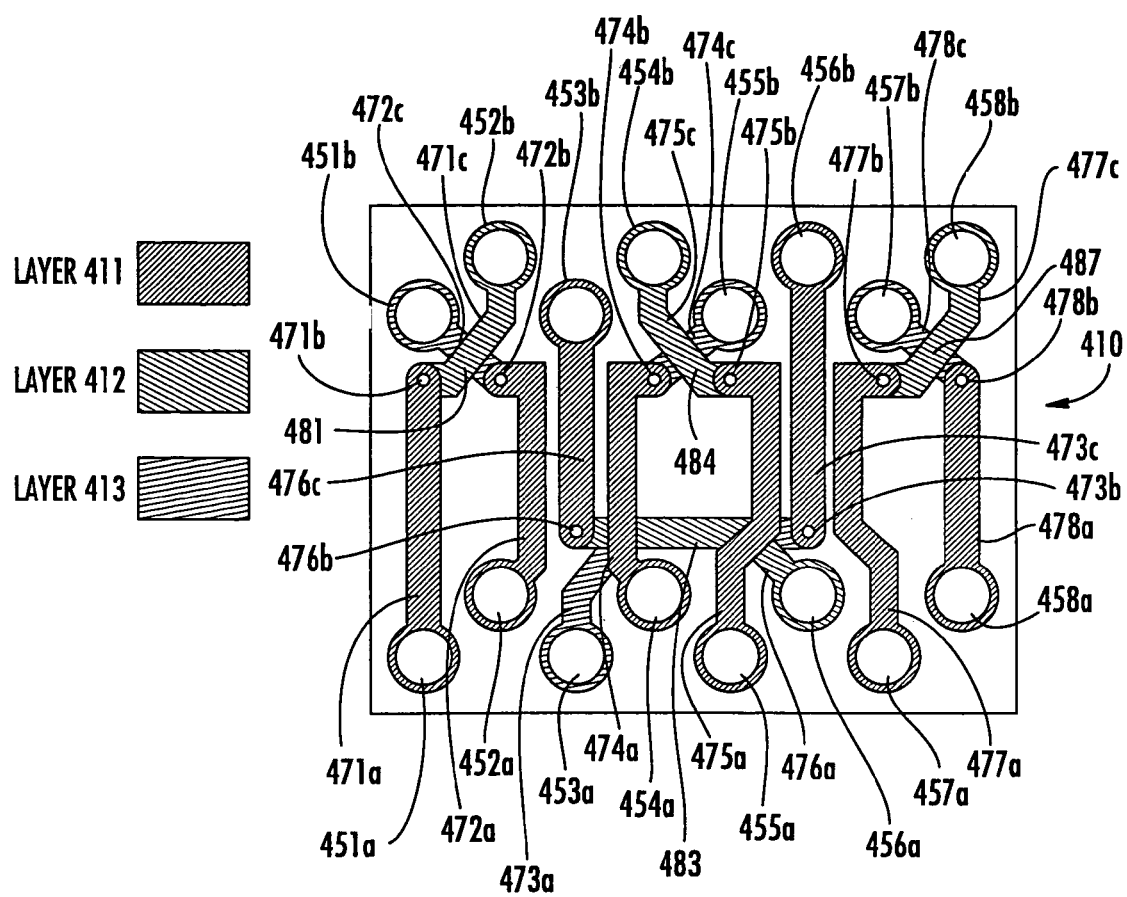
FIG. 15 is a front view of the floating PWB of the jack of FIG. 13.

Referring to FIGS. 13 and 15, the approaching segments 421a–428a can be divided into alternating groups. Odd-numbered approaching segments 421a, 423a, 425a, 427a veer from and enter the PWB 410 at a slightly lower elevation than the even-numbered segments 422a, 424a, 426a, 428a. Such offsetting of the segments can reduce the differential to differential crosstalk between the conductors of pairs 1 and 3 in the portions of the conductors between the contact line of a mating plug 405 and the PWB 410. In some embodiments, the offsetting of the odd-numbered segments 421a, 423a, 425a, 427a occurs as closely as possible to the contact line between the conductors 421–428 and the mating plug 405. This configuration can reduce the length of region I and, because it may be desirable for all of the regions to have similar lengths, it may in turn enable the lengths of regions II–IV to be reduced also. Thus, this configuration can reduce the overall length of the conductors 421–428, which may in some embodiments allow two crossovers (between regions I and II and between regions II and III) to be included on the PWB 410. It should be noted that differential to common mode crosstalk between (a) pairs 3 and 2 and (b) pairs 3 and 4 can be reduced by using a self-balancing plug, such as that described in co-assigned and co-pending U.S. patent application Ser. No. 11/051,305, filed Feb. 4, 2005, the disclosure of which is hereby incorporated herein in its entirety.

Referring again to FIGS. 13 and 14, the PWB 410 has three overlying layers 411–413 through which sixteen bores extend. One set of eight bores 451a–458a is arranged in a staggered pattern on a lower portion of the PWB 410, and another set of eight bores 451b–458b is arranged in a similar staggered pattern on an upper portion of the PWB 410. The bores 451a–458a receive, respectively, the approaching segments 421a–428a, and the bores 451b–458b receive, respectively, exiting segments 422b, 421b, 426b, 425b, 424b, 423b, 428b, 427b.

Turning first to the conductors 423, 426 of pair 3, a trace 473a travels on layer 413 from the bore 453a to a via 473b. A trace 473c then travels on the layer 411 from the via 473b to the bore 456b. A trace 476a travels on layer 412 from the bore 456a to a via 476b. This trace 476a crosses over the trace 473a, thereby creating a crossover 483 of the conductors of pair 3 between regions I and II as shown in FIG. 1. On layer 411, a trace 476c leads from via 476b to the bore 453b. Thus, the approaching segments 423a, 426a of the conductors 423, 426 are connected to the exiting segments 423b, 426b.

Turning now to the conductors 421, 422 of pair 4, a trace 471a extends on layer 411 between the bore 451a and a via 471b. A trace 471c extends on layer 412 between the via 471b and the bore 452b. A trace 472a on layer 411 extends between the bore 452a and a via 472b, from which a trace 472c travels on layer 413 to bore 451b. The trace 472c passes below the trace 471c, thereby creating a crossover 481 corresponding to the crossover of the conductors of pair 4 shown in FIG. 1.

Similar crossovers are created for the conductors of pair 1 and pair 2. Beginning with the conductors of pair 1, on layer 411 a trace 474a is routed from bore 454a to a via 474b, and a trace 474c extends on layer 413 from the via 474b to the bore 455b. A trace 475a extends between bore 455a and a via 475b on layer 411, and on layer 412 a trace 475c extends between the via 475b and the bore 454b. Thus, a crossover 484 that corresponds to the crossover of the conductors of pair 1 in FIG. 1 is created as the trace 474c passes below the trace 475c. As for the conductors of pair 2, a trace 477a extends on layer 411 between the bore 457a and a via 477b, and a trace 477c on layer 412 extends between the via 477b and the bore 458b. A trace 478a extends on layer 411 between the bore 458a and a via 478b, and on layer 413 a trace 478c extends from the via 478b to the bore 457b. Trace 478c passes below trace 477c, thus creating a crossover 487 that corresponds to the crossover of the conductors of pair 2 shown in FIG. 1.

Traces 472a, 476c and 474a, and similarly traces 475a, 473c and 477a, include a region where the traces run parallel and in close proximity to each other, thus forming region II of figure I. Coupling efficiency of the region II can be increased by bringing into close proximity only traces belonging to different pairs (e.g., 476c and 474a), while keeping apart traces belonging to the same pair (e.g., 474a and 475a). The exiting segments 421b–428b converge into a co-planar geometry, thus forming region III of FIG. 1.

Figure 16:
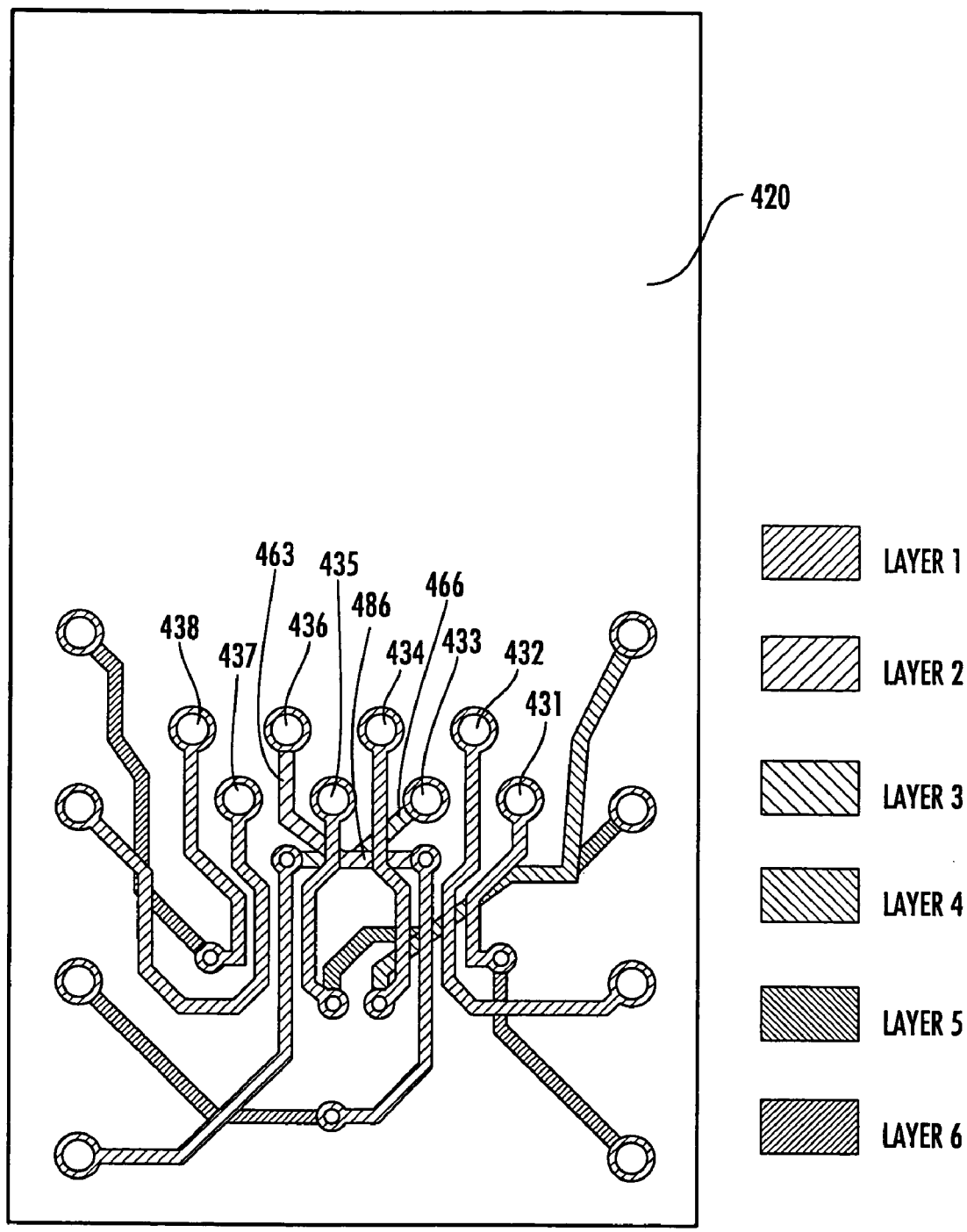
FIG. 16 is a top view of the wiring board of the jack of FIG. 13.

Referring now to FIG. 16, the wiring board 420 is similar to the wiring board 320 discussed in connection with FIGS. 10–12, with the exception that it encompasses the pair 3 crossover between regions III and IV in addition to region IV of FIG. 1. Also, unlike the wiring board 420, the coupling efficiency of the region IV may be increased by bringing into close proximity only traces belonging to different pairs, while keeping apart traces belonging to the same pair. Thus, the jack may have conductors with the desired crossovers described above and regions I–IV with relatively short effective lengths.

Those skilled in this art will recognize that other jack configurations may also be suitable for use with the present invention. For example, as discussed above, other configurations of jack frames, covers and terminal housings may also be employed with the present invention. As another example, the contact wires may not have crossovers between their free ends and their mounting locations on the mounting substrate (e.g., as depicted in U.S. Pat. No. 5,975,919 to Arnett et al.), with all the crossovers as well as regions II–IV of the arrangement of FIG. 1 implemented by deposition of traces on the mounting substrate. Alternatively, the entire jack portion of the FIG. 1 arrangement can be implemented by an array of unitized contacts, incorporating the appropriate physical crossovers and coplanar regions. Further, these unitized contacts may incorporate the IDCs or may mount into a mounting substrate with appropriate traces deposited thereon to connect them to such IDCs. As yet another example, the contacts may mount in locations that do not follow the staggered mounting scheme illustrated herein (an exemplary alternative in which the contact wires have a "duo-diagonal" arrangement is illustrated in U.S. Pat. No. 6,196,880 to Goodrich et al). As a further example, the IDCs may mount in a different pattern on the wiring board, or some other type of connector may be used. Those skilled in this art will also recognize that embodiments of the wiring board described above may be employed in other environments in which a communications jack may be found. For example, jacks within a patch panel or series of patch panels may be suitable for use with such wiring boards. Other environments may also be possible.

The configuration illustrated and described herein can provide connectors, and in particular communications jacks, that exhibit improved crosstalk characteristics, particularly at elevated frequencies. For example, a connector such as that illustrated in FIGS. 1–16 and mated with a conventional plug may have channel alien NEXT of less than −60 dB power sum at 100 MHz, and less than −49.5 dB power sum at 500 MHz.

Further, those skilled in the art will recognize the reciprocity that exists between the differential to common mode crosstalk induced on a first pair, when a second pair is excited differentially, and the common mode to differential signal induced on the second of these pairs when the first of these pairs is excited common-modally, with the common mode to differential crosstalk equaling the differential to common mode crosstalk multiplied by a constant, that constant being the ratio of the differential to common mode impedances. Consequently, when an improvement occurs, due to the current invention, in the differential to common mode crosstalk between two pairs when one of these pairs is excited differentially, a corresponding improvement occurs in the common mode to differential crosstalk between these two pairs, when the other of these pairs is excited common-modally.

The foregoing is illustrative of the present invention and is not to be construed as limiting thereof. Although exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. The invention is defined by the following claims, with equivalents of the claims to be included therein.

That which is claimed is:

1. A communications connector, comprising:
   a dielectric mounting substrate;
   at least four pairs of conductors mounted on the mounting substrate, each of the conductors including a free end segment;
   at least four pairs of terminals mounted on the mounting substrate, wherein each of the pairs of terminals is electrically connected to a respective pair of conductors;
   wherein a first pair of conductor free end segments is immediately adjacent each other, a second pair of conductor free end segments is immediately adjacent each other and positioned on one side of the first pair, a fourth pair of conductor free end segments is immediately adjacent each other and positioned on an opposite side of the first pair, and a third pair of conductor free end segments sandwiches the first pair, with one of the conductor free end segments of the third pair being disposed between the first and second pairs, and the other of the conductor free end segments being disposed between the first and fourth pairs;
   wherein each of the first, second and fourth pairs of conductors includes a crossover between the conductors of the pairs, and wherein the third pair of conductors includes two crossovers between its conductors.

2. The communications connector defined in claim 1, further comprising a wiring board positioned between the free end segments of the conductors and fixed end segments of the conductors mounted in the mounting substrate, wherein the wiring board includes conductive traces that electrically connect the free end and fixed end segments of each of the conductors.

3. The communications connector defined in claim 2, wherein the crossovers in the first, second, third and fourth pairs of conductors are created in the conductive traces in the wiring board.

4. The communications connector defined in claim 2, wherein one of the crossovers in the third pair of conductors is created in the conductive traces in the wiring board.

5. The communications connector defined in claim 2, wherein both of the crossovers of the third pair of conductors are created in the conductive traces in the wiring board.

6. The communications connector defined in claim 2, wherein the mounting substrate includes conductive traces that connect the fixed end portions of the pairs of conductors to respective terminals.

7. The communications connector defined in claim 6, wherein one of the crossovers in the third pair of connectors is created in the conductive traces on the mounting substrate.

8. The communications connector defined in claim 6, wherein the crossovers in the first, second and fourth pairs of connectors are created in the conductive traces on the mounting substrate.

9. The communications connector defined in claim 1, wherein one of the crossovers in the third pair of conductors occurs before the crossovers in the first, second and fourth pairs of conductors, and the other of the crossovers in the third pair of conductors occurs after the crossovers in the first, second and fourth pairs of conductors.

10. The communications connector defined in claim 2, wherein the wiring board is suspended above the mounting substrate by the conductors.

11. The communications connector defined in claim 10, wherein the mounting substrate includes an aperture sized and positioned to receive a portion of the wiring board when the free end segments of the conductors are deflected by a mating connector.

12. The communications connector defined in claim 1, wherein the conductors define first, second, third and fourth regions, the first region being located in the free end segments of the conductors, the second region following a first of the two crossovers of the third pair, the third region following the crossovers of the first, second and fourth pairs, and the fourth region following the second of the two crossovers of the third pair.

13. The communications connector defined in claim 12, wherein the arrangement of the conductors of the first, second, third and fourth pairs of conductors is such that the effective compensating lengths of the first, second, third and fourth regions are generally the same.

14. The communications connector defined in claim 2, wherein the fixed end segments of the third pair enter the wiring board at an elevation that differs from an elevation in which the free end segments of the first, second and fourth pairs enter the wiring board.

15. The communications connector defined in claim 2, wherein the fixed end segments of the conductors enter the wiring board in staggered locations.

16. A communications connector, comprising:
a dielectric mounting substrate;
at least four pairs of conductors mounted on the mounting substrate, each of the conductors including a free end segment;
at least four pairs of terminals mounted on the mounting substrate, wherein each of the pairs of terminals is electrically connected to a respective pair of conductors;
wherein a first pair of conductor free end segments is immediately adjacent each other, a second pair of conductor free end segments is immediately adjacent each other and positioned on one side of the first pair, a fourth pair of conductor free end segments is immediately adjacent each other and positioned on an opposite side of the first pair, and a third pair of conductor free end segments sandwiches the first pair, with one of the conductor free ends of the third pair being disposed between the first and second pairs, and the other of the conductor free end segments being disposed between the first and fourth pairs;
further comprising a wiring board positioned between the free end segments of the conductors and fixed end segments of the conductors mounted in the mounting substrate, wherein the wiring board includes conductive traces that electrically connect the free end and fixed end segments of each of the conductors; and
wherein the third pair of conductors forms a crossover on the wiring board, and wherein the first, second and fourth pairs of conductors include a crossover.

17. The communications connector defined in claim 16, wherein the crossovers in the first, second, third and fourth pairs of conductors are created in the conductive traces in the wiring board.

18. The communications connector defined in claim 16, wherein a second crossover in the third pair of conductors is created in the conductive traces in the wiring board.

19. The communications connector defined in claim 16, wherein both of the crossovers of the third pair of conductors are created in the conductive traces in the wiring board.

20. The communications connector defined in claim 16, wherein the mounting substrate includes conductive traces that connect the fixed end segments of the pairs of conductors to respective terminals.

21. The communications connector defined in claim 20, wherein a second crossover in the third pair of connectors is created in the conductive traces on the mounting substrate.

22. The communications connector defined in claim 20, wherein the crossovers in the first, second and fourth pairs of connectors are created in the conductive traces on the mounting substrate.

23. The communications connector defined in claim 16, wherein the third pair of conductors includes two crossovers, and wherein one of the crossovers in the third pair of conductors occurs before the crossovers in the first, second and fourth pairs of conductors, and the other of the crossovers in the third pair of conductors occurs after the crossovers in the first, second and fourth pairs of conductors.

24. The communications connector defined in claim 16, wherein the wiring board is suspended above the mounting substrate by the conductors.

25. The communications connector defined in claim 24, wherein the mounting substrate includes an aperture sized and positioned to receive a portion of the wiring board when the free end segments of the conductors are deflected by a mating connector.

26. The communications connector defined in claim 16, wherein the free end segments of the third pair enter the wiring board at an elevation that differs from an elevation in which the free end segments of the first, second and fourth pairs enter the wiring board.

27. The communications connector defined in claim 16, wherein the free end segments of the conductors enter the wiring board in staggered locations.

28. A communications connector, comprising:
a dielectric mounting substrate;
at least four pairs of conductors mounted on the mounting substrate, each of the conductors including a free end segment;
at least four pairs of terminals mounted on the mounting substrate, wherein each of the pairs of terminals is electrically connected to a respective pair of conductors;
wherein a first pair of conductor free end segments is immediately adjacent each other, a second pair of conductor free end segments is immediately adjacent each other and positioned on one side of the first pair, a fourth pair of conductor free end segments is immediately adjacent each other and positioned on an opposite side of the first pair, and a third pair of conductor free end segments sandwiches the first pair, with one of the conductor free end segments of the third pair being disposed between the first and second pairs, and the other of the conductor free end segments being disposed between the first and fourth pairs;
wherein the conductors define first, second, third and fourth coupling regions;
wherein the number of the first, second, third and fourth regions having positive differential to differential coupling equals the number of first, second, third and fourth regions having negative differential to differential coupling between the third pair and any of the first, second and fourth pairs;

wherein the number of first, second, third and fourth regions having positive differential to common mode coupling equals the number of first, second, third and fourth regions having negative differential to common mode coupling for at least two different combinations of two of the first, second, third and fourth pairs;

wherein a total amount of positive differential to common mode coupling on a first of the at least two different combinations is substantially equal to a total amount of negative differential to common mode coupling on the first of the at least two different combinations; and wherein a total amount of positive differential to common mode coupling on a second of the at least two different combinations is substantially equal to a total amount of negative differential to common mode coupling on the second of the at least two different combinations.

29. The communications connector defined in claim 28, wherein the arrangement of the conductors of the first, second, third and fourth pairs of conductors is such that the effective compensating lengths of the first, second, third and fourth regions are generally the same.

30. A communications jack, comprising:
a first input terminal, a first output terminal, and a first conductive path electrically connecting the first input terminal to the first output terminal;
a second input terminal, a second output terminal, and a second conductive path electrically connecting the second input terminal to the second output terminal;
a third input terminal, a third output terminal, and a third conductive path electrically connecting the third input terminal to the third output terminal;
a fourth input terminal, a fourth output terminal, and a fourth conductive path electrically connecting the fourth input terminal to the fourth output terminal;
a fifth input terminal, a fifth output terminal, and a fifth conductive path electrically connecting the fifth input terminal to the fifth output terminal;
a sixth input terminal, a sixth output terminal, and a sixth conductive path electrically connecting the sixth input terminal to the sixth output terminal;
a seventh input terminal, a seventh output terminal, and a seventh conductive path electrically connecting the seventh input terminal to the seventh output terminal;
an eighth input terminal, an eighth output terminal, and an eighth conductive path electrically connecting the eighth input terminal to the eighth output terminal;
wherein the fourth and fifth conductive paths comprise a first pair of conductive paths for carrying a first differential signal;
wherein the first and second conductive paths comprise a second pair of conductive paths for carrying a second differential signal;
wherein the third and sixth conductive paths comprise a third pair of conductive paths for carrying a third differential signal;
wherein the seventh and eighth conductive paths comprise a fourth pair of conductive paths for carrying a fourth differential signal;
wherein the first through eighth input terminals are aligned in numerical order;
wherein the third pair of conductive paths includes a first crossover and a second crossover; and
wherein the first pair of conductive paths includes a third crossover.

31. The communications jack defined in claim 30, wherein the third crossover is located between the first crossover and the second crossover.

32. The communications jack defined in claim 31, wherein the second pair of conductive paths includes a fourth crossover and wherein the fourth pair of conductive paths includes a fifth crossover.

33. The communications jack defined in claim 32, wherein the first, second and fourth pairs of conductive paths each include only one crossover.

34. The communications jack defined in claim 33, wherein the third pair of conductive paths includes only the first and second crossovers.

35. The communications jack defined in claim 31, wherein the fourth crossover and the fifth crossover are both between the first crossover and the second crossover.

36. The communications jack defined in claim 30, wherein each of the input terminals comprises a contact region of a jackwire contact.

37. A communications jack, comprising:
a first input terminal, a first output terminal, and a first conductive path electrically connecting the first input terminal to the first output terminal;
a second input terminal, a second output terminal, and a second conductive path electrically connecting the second input terminal to the second output terminal;
a third input terminal, a third output terminal, and a third conductive path electrically connecting the third input terminal to the third output terminal;
a fourth input terminal, a fourth output terminal, and a fourth conductive path electrically connecting the fourth input terminal to the fourth output terminal;
a fifth input terminal, a fifth output terminal, and a fifth conductive path electrically connecting the fifth input terminal to the fifth output terminal;
a sixth input terminal, a sixth output terminal, and a sixth conductive path electrically connecting the sixth input terminal to the sixth output terminal;
a seventh input terminal, a seventh output terminal, and a seventh conductive path electrically connecting the seventh input terminal to the seventh output terminal;
an eighth input terminal, an eighth output terminal, and an eighth conductive path electrically connecting the eighth input terminal to the eighth output terminal;
wherein the fourth and fifth conductive paths comprise a first pair of conductive paths for carrying a first differential signal;
wherein the first and second conductive paths comprise a second pair of conductive paths for carrying a second differential signal;
wherein the third and sixth conductive paths comprise a third pair of conductive paths for carrying a third differential signal;
wherein the seventh and eighth conductive paths comprise a fourth pair of conductive paths for carrying a fourth differential signal;
wherein the first through eighth input terminals are aligned in numerical order;
wherein the differential to differential coupling between the third pair of conductive paths and each of the first, second and fourth pairs of conductive paths is substantially cancelled;
wherein the differential to common mode coupling is substantially cancelled between the third pair of conductive paths and each of the first, second and fourth pairs of conductive paths; and
wherein the differential to common mode coupling is substantially cancelled between the second pair of conductive paths and at least one of the first, third or fourth pairs of conductive paths.

38. The communications jack defined in claim 37, wherein the differential to common mode coupling is also substantially cancelled between the fourth pair of conductive paths and at least one of the first, second and third conductive paths.

39. The communications jack defined in claim 37, wherein the differential to common mode coupling is substantially cancelled between all 12 different combinations of two of the first, second, third and fourth pairs of conductive paths.

40. The communications connector defined in claim 37, wherein the differential to common mode coupling is also substantially cancelled between the first pair of conductive paths and at least one of the second, third and fourth conductive paths.

41. The communications connector defined in claim 37, wherein the differential to common mode coupling is substantially cancelled between the second pair of conductive paths and each of the first, third and fourth conductive paths.

42. The communications connector defined in claim 38, wherein the differential to common mode coupling is substantially cancelled between the fourth pair of conductive paths and each of the first, second and third conductive paths.

43. The communications connector defined in claim 40, wherein the differential to common mode coupling is substantially cancelled between the first pair of conductive paths and each of the second, third and fourth conductive paths.

44. The communications connector defined in claim 37, wherein the differential to common mode coupling is substantially cancelled between the second pair of conductive paths and each of the second, third and fourth conductive paths, and wherein the differential to common mode coupling is substantially cancelled between the first pair of conductive paths and each of the second, third and fourth conductive paths.

45. The communications connector defined in claim 37, wherein each of the input terminals comprises a contact region of a jackwire contact.

* * * * *